(12) United States Patent
Choi et al.

(10) Patent No.: US 12,490,577 B2
(45) Date of Patent: Dec. 2, 2025

(54) LIGHT EMITTING DEVICE AND DISPLAY APPARATUS INCLUDING THE SAME

(71) Applicant: Samsung Display Co., Ltd., Yongin-si (KR)

(72) Inventors: Jungho Choi, Yongin-si (KR); Pilgu Kang, Hwaseong-si (KR); Seulong Kim, Cheonan-si (KR); Hajin Song, Hwaseong-si (KR); Dongseob Jeong, Suwon-si (KR); Yang-Jin Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 781 days.

(21) Appl. No.: 17/745,604

(22) Filed: May 16, 2022

(65) Prior Publication Data
US 2023/0084087 A1 Mar. 16, 2023

(30) Foreign Application Priority Data
Aug. 25, 2021 (KR) .......... 10-2021-0112660

(51) Int. Cl.
*H10K 50/13* (2023.01)
*H10K 50/11* (2023.01)
*H10K 50/15* (2023.01)
*H10K 50/16* (2023.01)
*H10K 50/17* (2023.01)
*H10K 59/38* (2023.01)
*H10K 101/40* (2023.01)
*H10K 102/00* (2023.01)

(52) U.S. Cl.
CPC ............ *H10K 50/15* (2023.02); *H10K 50/11* (2023.02); *H10K 50/16* (2023.02); *H10K 50/171* (2023.02); *H10K 59/38* (2023.02); *H10K 2101/40* (2023.02); *H10K 2102/331* (2023.02)

(58) Field of Classification Search
None
See application file for complete search history.

(56) References Cited

U.S. PATENT DOCUMENTS

| | | | |
|---|---|---|---|
| 8,148,891 B2 | 4/2012 | Tung et al. | |
| 9,368,742 B2 | 6/2016 | Kawata et al. | |
| 10,115,920 B2 | 10/2018 | Kim | |
| 10,680,195 B2 | 6/2020 | Kim et al. | |
| 10,910,580 B2 | 2/2021 | Choi et al. | |
| 11,121,196 B2 | 9/2021 | Lee et al. | |
| 11,574,962 B2 | 2/2023 | Ha et al. | |
| 2011/0291080 A1 | 12/2011 | Schmid et al. | |
| 2013/0277654 A1 | 10/2013 | Seo et al. | |
| 2013/0320837 A1* | 12/2013 | Weaver | H10K 50/13 313/504 |
| 2016/0181560 A1* | 6/2016 | Yamamoto | H10K 50/13 257/40 |
| 2016/0351809 A1 | 12/2016 | Li et al. | |
| 2017/0025630 A1 | 1/2017 | Seo et al. | |
| 2018/0190193 A1* | 7/2018 | Kim | H10K 50/131 |
| 2018/0208836 A1 | 7/2018 | Kuma et al. | |
| 2020/0266374 A1* | 8/2020 | Ko | H10K 85/6574 |
| 2020/0388779 A1 | 12/2020 | Ohsawa et al. | |
| 2021/0013273 A1 | 1/2021 | Jeong et al. | |
| 2021/0175456 A1* | 6/2021 | Song | H10K 50/19 |
| 2021/0175457 A1* | 6/2021 | Park | H10K 50/11 |
| 2021/0184135 A1* | 6/2021 | Kim | H10K 85/6576 |
| 2021/0202876 A1* | 7/2021 | Kim | H10K 50/11 |
| 2021/0234115 A1 | 7/2021 | Seo et al. | |
| 2022/0204438 A1* | 6/2022 | Kubota | C07C 211/54 |
| 2024/0349531 A1* | 10/2024 | Watabe | H05B 33/12 |

FOREIGN PATENT DOCUMENTS

| | | |
|---|---|---|
| KR | 10-2014-0059713 A | 5/2014 |
| KR | 10-1567661 B1 | 11/2015 |
| KR | 20160094378 A | 8/2016 |
| KR | 10-2017-0040851 A | 4/2017 |
| KR | 20170080287 A | 7/2017 |
| KR | 10-2017-0106564 A | 9/2017 |
| KR | 10-2098139 B1 | 4/2020 |
| KR | 10-2020-0080484 A | 7/2020 |
| KR | 10-2021-0038715 A | 4/2021 |
| KR | 10-2021-0091384 A | 7/2021 |
| KR | 20210100753 A | 8/2021 |
| WO | 2015/083021 A1 | 6/2015 |

* cited by examiner

*Primary Examiner* — Robert S Loewe
(74) *Attorney, Agent, or Firm* — Womble Bond Dickinson (US) LLP

(57) ABSTRACT

Provided is a light emitting device including a first electrode, a hole transport region on the first electrode, a first light emitting layer on the hole transport region and emitting light of a first wavelength, a second light emitting layer on the hole transport region and emitting light of a second wavelength different from the first wavelength, an electron transport region on the first light emitting layer and the second light emitting layer, and a second electrode on the electron transport region. The second light emitting layer includes a first sub-light emitting layer including a first host having a first hole transporting host and a first electron transporting host and a dopant emitting light of the second wavelength, and a second sub-light emitting layer including a second host and a second hole transporting host, but not including the dopant. The light emitting device provides improved light emitting efficiency.

21 Claims, 9 Drawing Sheets

LIGHT EMITTING DEVICE AND DISPLAY APPARATUS INCLUDING THE SAME

CROSS-REFERENCE TO RELATED APPLICATION

This application claims priority to and the benefit of Korean Patent Application No. 10-2021-0112660, filed on Aug. 25, 2021, the entire contents of which are hereby incorporated by reference.

BACKGROUND

1. Field

Embodiments of the present disclosure relate to a light emitting device and a display device including the same, and for example, to a light emitting device having improved (increased) light emitting efficiency and device lifespan and a display device including the same.

2. Description of the Related Art

An organic light emitting device is a self-luminous based device having a short response time and driven by a low voltage. Accordingly, an organic light emitting display device including the organic light emitting device may not include a separate light source, and thus, may be lightweight and thin, and therefore has a number of advantages such as having excellent (increased) luminance and no or substantially no viewing angle dependency.

The organic light emitting device is a display device having a light emitting layer made of an organic matter between an anode and a cathode. A hole provided from the anode and an electron provided from the cathode are combined in the light emitting layer to form an exciton, and light corresponding to energy between the hole and the electron is generated from the exciton.

A tandem organic light emitting device has a structure consisting of or comprising two or more stacks of a hole transport layer/a light emitting layer/an electron transport layer between an anode and a cathode, and a charge generation layer which assists in the generation and movement of charges is present between each stack.

SUMMARY

Embodiments of the present disclosure provide a light emitting device with improved (increased) light emitting efficiency and device lifespan.

The present disclosure also provides a display device having improved (increased) display efficiency.

An embodiment of the disclosure provides a light emitting device including a first electrode, a hole transport region on the first electrode, a first light emitting layer on the hole transport region and emitting light of a first wavelength, a second light emitting layer on the hole transport region and emitting light of a second wavelength different from the first wavelength, an electron transport region on the first light emitting layer and the second light emitting layer, and a second electrode on the electron transport region, wherein the second light emitting layer includes a first sub-light emitting layer including a first host having a first hole transporting host and a first electron transporting host and a dopant emitting the light of the second wavelength, and a second sub-light emitting layer including a second host and a second hole transporting host, but not including the dopant.

In an embodiment, the first wavelength may be 420 nm to 480 nm, and the second wavelength may be 520 nm to 600 nm.

In an embodiment, the first hole transporting host may have a LUMO energy level value higher than that of the first electron transporting host, and the second hole transporting host may have a LUMO energy level value equal to or lower than that of the first hole transporting host, and may also have a LUMO energy level value higher than that of the first electron transporting host.

In an embodiment, the lower limit value of the LUMO energy level of the second hole transporting host may be an average value of the LUMO energy level of the first hole transporting host and the LUMO energy level of the first electron transporting host.

In an embodiment, the LUMO energy level value of the second hole transporting host may be −1.94 eV to −2.32 eV.

In an embodiment, in the second sub-light emitting layer, a ratio of the second host to the second hole transporting host may be in the range of 99:1 to 5:95.

In an embodiment, the second host may include a third hole transporting host and a second electron transporting host.

In an embodiment, the light emitting device may further include a charge generation layer between the first light emitting layer and the second light emitting layer.

In an embodiment, the charge generation layer may include a p-type charge generation layer doped with a p-type dopant, and an n-type charge generation layer doped with an n-type dopant.

In an embodiment, the light emitting device may further include a first additional light emitting layer between the hole transport region and the electron transport region, and emitting the light of the first wavelength.

In an embodiment, the light emitting device may further include a second additional light emitting layer between the first light emitting layer and the second light emitting layer, and emitting the light of the first wavelength.

In an embodiment, the hole transport region may include a hole injection layer on the first electrode, and a hole transport layer on the hole injection layer, and the electron transport region may include an electron transport layer on the first light emitting layer and the second light emitting layer, and an electron injection layer on the electron transport layer.

In an embodiment, the light emitting device may further include a capping layer on the second charge generation layer. In an embodiment, the capping layer may have a refractive index of 1.6 or greater.

In an embodiment, the first sub-light emitting layer and the second sub-light emitting layer may be in contact with each other.

In an embodiment, the light emitting device may further include an intermediate electron transport layer between the first light emitting layer and the first charge generation layer, and an intermediate hole transport layer between the first charge generation layer and the second light emitting layer.

In an embodiment of the present disclosure, a display device includes a display panel having a first pixel region emitting light of a first wavelength, a second pixel region emitting light of a second wavelength different from the first wavelength, and a third pixel region emitting light of a third wavelength different from the second wavelength, and the display device further includes a light emitting device overlapping the first pixel region to the third pixel region, a light control layer on the display panel, a first light control unit overlapping the first pixel region, a second light control unit overlapping the second pixel region, and a third light control unit overlapping the third pixel region, wherein the light emitting device includes a first electrode, a hole transport region on the first electrode, a first light emitting layer on the hole transport region and emitting the light of the first wavelength, a second light emitting layer on the hole transport region and emitting the light of the second wavelength, an electron transport region on the first light emitting layer and the second light emitting layer, and a second electrode on the electron transport region, wherein the second light emitting layer includes a first sub-light emitting layer including a first host having a first hole transporting host and a dopant emitting the light of the second wavelength, and a second sub-light emitting layer including a second host and a second hole transporting host having a LUMO energy level equal to or lower than that of the first hole transporting host.

In an embodiment, the first wavelength may be 420 nm to 480 nm, and the second wavelength may be 520 nm to 600 nm.

In an embodiment, the first host may further include a first electron transporting host.

In an embodiment, the second light control unit may include a quantum dot configured to convert light of the first wavelength to light of the second wavelength, and the third light control unit may include a quantum dot configured to convert the light of the first wavelength or the light of the second wavelength to light of the third wavelength.

In an embodiment, the display device may further include a color filter layer on the light control layer.

BRIEF DESCRIPTION OF THE DRAWINGS

The above and other aspects of embodiments and features of certain embodiments of the disclosure will be more apparent from the following description taken in conjunction with the accompanying drawings, in which.

DETAILED DESCRIPTION

Figure 1:
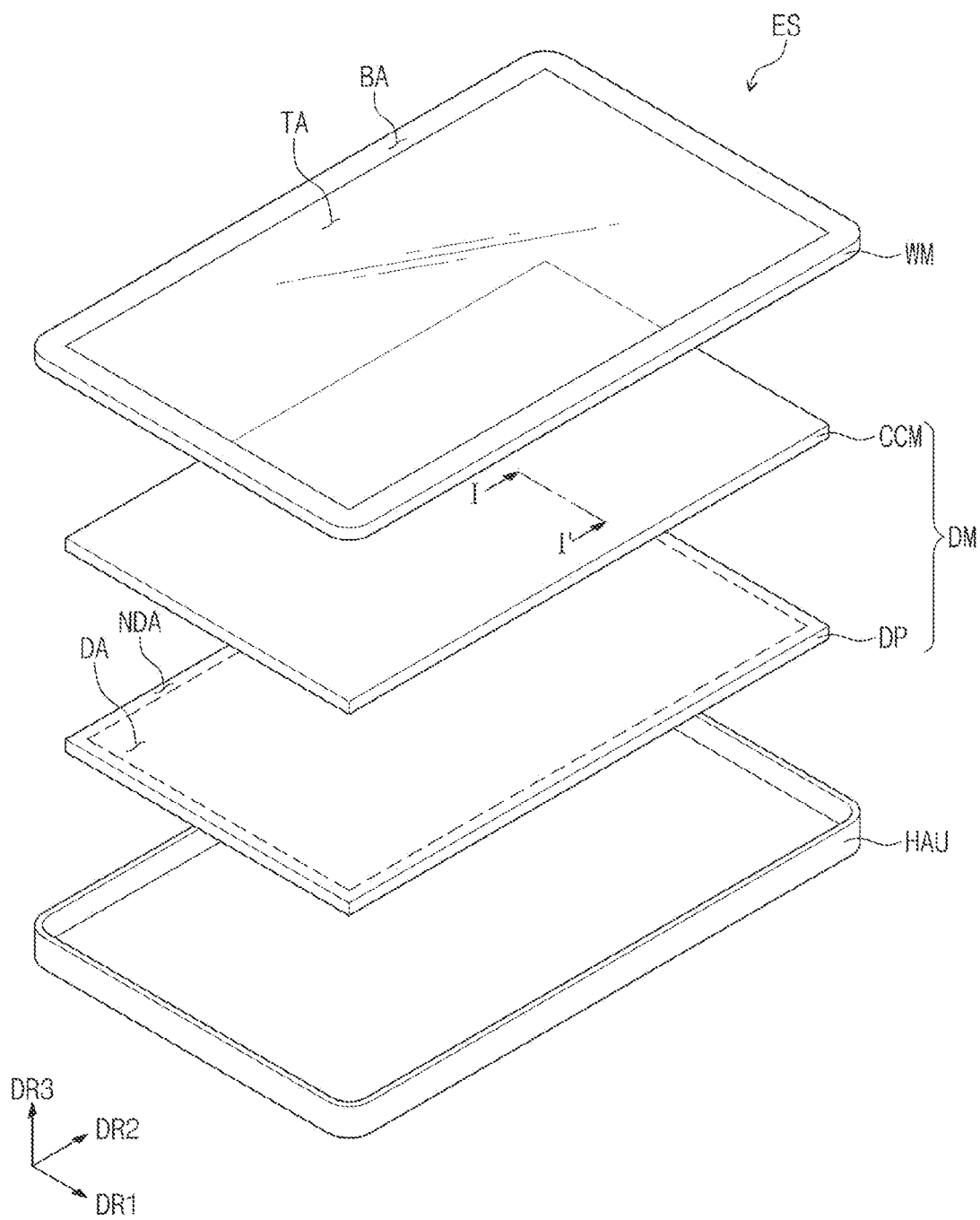
FIG. 1 is an exploded perspective view of a display device according to an embodiment.

In the present disclosure, when an element (or a region, a layer, a portion, and the like) is referred to as being "on," "connected to," or "coupled to" another element, it means that the element may be directly on/connected to/coupled to the other element, or that a third element may be therebetween.

Like reference numerals refer to like elements. Also, in the drawings, the thickness, the ratio, and the dimensions of elements may be exaggerated for an effective description of technical contents. The term "and/or," includes all combinations of one or more of which associated components may define.

It will be understood that, although the terms "first", "second", etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the present disclosure. The terms of a singular form may include plural forms unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

In the present disclosure, if a portion such as a layer, a film, a region, or a plate is referred to as being "on" or "above" the other portion, it includes not only the case in which the portion is "directly on" the other portion, but also the case in which another portion is therebetween. In addition, when a portion such as a layer, a film, a region, or a plate is referred to as being "under" or "below" the other portion, it includes not only the case in which the portion is "directly under" the other portion, but also the case in which another portion is therebetween. Furthermore, in the present disclosure, being "on" not only includes the case of being above, but also the case of being below.

In addition, in the present disclosure, being "directly disposed" or "directly on" may mean that there is no layer, film, region, plate, or the like added between a portion of a layer, a film, a region, a plate, and/or the like and other portions. For example, being "directly on" may mean that an additional member is not between two layers or two members.

Unless otherwise defined, all terms (including technical and scientific terms) used herein have the same meaning as commonly understood by one of ordinary skill in the art to which the present disclosure pertains. It should also be understood that terms such as terms defined in commonly used dictionaries should be interpreted as having meanings consistent with the meanings in the context of the related art, and should not be interpreted in too ideal a sense or in an overly formal sense unless explicitly defined herein.

Hereinafter, a display device and a light emitting device according to an embodiment of the present disclosure will be described with reference to the accompanying drawings.

Figure 2:
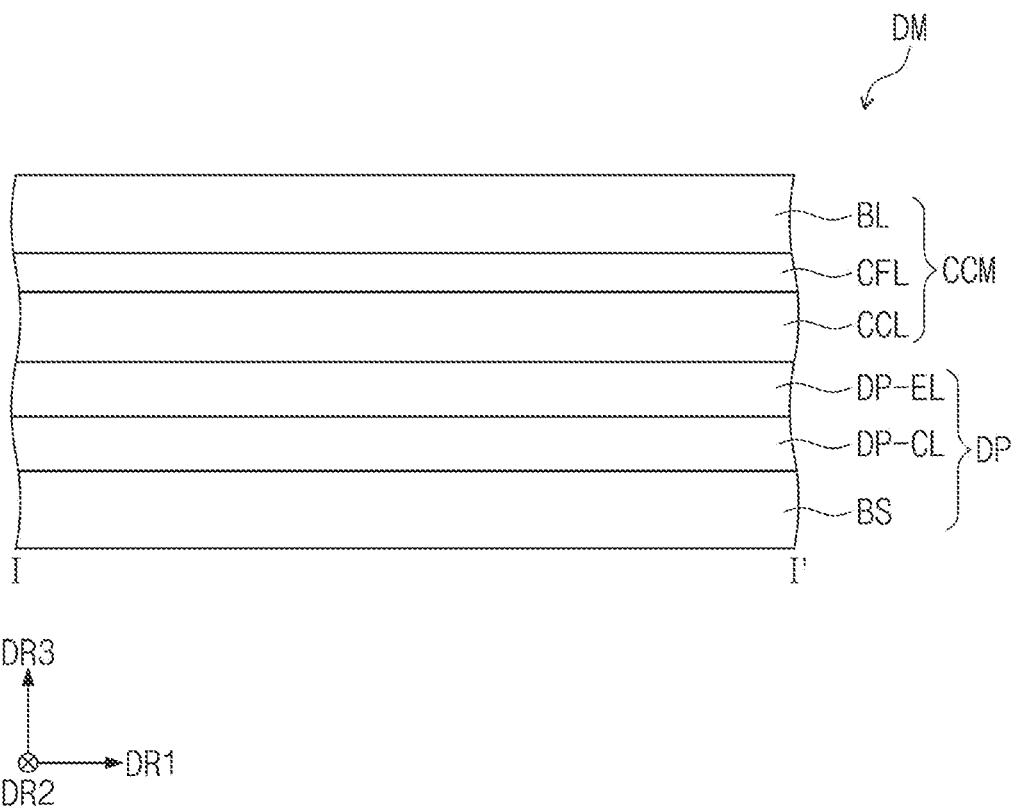
FIG. 2 is a cross-sectional view of a display module according to an embodiment.

FIG. 1 is an exploded perspective view of a display device according to an embodiment. FIG. 2 is a cross-sectional view of a display module according to an embodiment. FIG. 2 shows a cross-sectional view corresponding to line I-I' of FIG. 1.

In an embodiment, a display device ES may be a large display device such as a television, a monitor, or an external advertisement board. Also, the display device ES may be a display device used in a small and medium-sized product such as a personal computer, a notebook computer, a personal digital terminal, a car navigation system unit, a game machine, a smart phone, a tablet, and/or a camera. In addition, it should be understood that these are merely examples, and other display devices may also be used without departing from the scope of the present disclosure.

The display device ES of an embodiment may include a window WM, a display module DM, and a housing HAU. The display module DM may include a display panel DP. In some embodiments, the display device ES may include various suitable elements which are activated in response to an electrical signal, such as a display element, a touch element, or a detection element.

In FIG. 1 and the following drawings, a first direction DR1 to a third direction DR3 are illustrated. Directions indicated by the first to third directions DR1, DR2, and DR3 described in the present disclosure are a relative concept, and may be converted to different directions.

In the present disclosure, for convenience of description, the third direction DR3 is defined as a direction in which an image is provided to a user. Also, the first direction DR1 and the second direction DR2 are perpendicular to each other, and the third direction DR3 may be a normal direction with respect to a plane defined by the first direction DR1 and the second direction DR2. In FIG. 1, the plane defined by the first direction DR1 and the second direction DR2 may be a display surface on which an image is provided.

In the display device ES of an embodiment, the window WM may be on the display module DM. The window WM may be a material including glass, sapphire, or plastic. The window WM includes a transmissive region TA which transmits an image provided from the display module DM and a light blocking region BA which is adjacent to the transmissive region TA and does not transmit an image. In addition, unlike what is illustrated in FIG. 1, in the display device ES of an embodiment, the window WM may be omitted.

In the display device ES of an embodiment, the display module DM may be in a lower portion of the window WM. The display module DM may include the display panel DP, and a light control member CCM on the display panel DP.

The display panel DP may be a light emitting-type display panel. For example, the display panel DP may be a light-emitting diode (LED) display panel, an organic electroluminescence display panel, or a quantum dot light emitting display panel. However, embodiments of the present disclosure are not limited thereto.

The light-emitting diode (LED) display panel may include a light emitting diode, and a light emitting layer of the organic electroluminescence display panel includes an organic electroluminescence material, and a light emitting layer of the quantum dot light emitting display panel may include a quantum dot or a quantum rod. Hereinafter, the display panel DP included in the display device ES of an embodiment is described as an organic electroluminescence display panel. However, embodiments of the present disclosure are not limited to this kind of display panel.

The display device ES of an embodiment includes the display panel DP and the light control member CCM on an upper side of the display panel DP, and the display device ES of an embodiment may be an organic electroluminescence display device including an organic electroluminescence display panel. The display panel DP may provide a first color light having a set or predetermined wavelength. For example, the display panel DP may provide blue light as the first light. However, embodiments of the present disclosure are not limited thereto. The display panel DP may emit white light.

The light control member CCM may convert the wavelength of the first light provided from the display panel DP, or may transmit the first light provided from the display panel DP. The light control member CCM may convert the wavelength of the first light provided from the display panel DP, or may transmit the first light.

On a plane, one surface of the display panel DP on which an image is displayed is defined as a display surface. The display surface includes a display region DA in which an image is displayed and a non-display region NDA in which an image is not displayed. The display region DA may be defined in the center of the display panel DP on a plane, and may overlap the transmissive region TA of the window WM.

The housing HAU may be in a lower portion of the display panel DP to receive the display panel DP. The housing HAU may be covering the display panel DP such that an upper surface of the display panel DP, which is the display surface, may be exposed. The housing HAU covers a side surface and a bottom surface of the display panel DP, and may expose the entire upper surface.

Referring to FIG. 2, the display DP may include a base substrate BS, a circuit layer DP-CL provided on the base substrate BS, and a display element layer DP-EL. In an embodiment, the base substrate BS, the circuit layer DP-CL, and the display element layer DP-EL may be sequentially stacked in the third direction DR3.

The base substrate BS may be a member which provides a base surface on which the display element layer DP-EL is disposed. The base substrate BS may be a glass substrate, a metal substrate, a plastic substrate, or the like. However, embodiments of the present disclosure are not limited thereto, and the base substrate BS may be an inorganic layer, an organic layer, and/or a composite material layer.

In an embodiment, the circuit layer DP-CL may be on the base substrate BS, and the circuit layer DP-CL may include a plurality of transistors. Each of the transistors may include a control electrode, an input electrode, and an output electrode. For example, the circuit layer DP-CL may include a switching transistor and a driving transistor for driving a light emitting device ED (see e.g., FIG. 4A) of the display element layer DP-EL.

The light control member CCM is on the display panel DP. The light control member CCM may include a light control layer CCL, a color filter layer CFL, and an upper base layer BL. For example, the display panel DP may include the light emitting device ED (see FIG. 4A) which emits light of a first wavelength and/or light of a second wavelength, and the light control member CCM may include the light control layer CCL (see FIG. 4A) which either converts the wavelength of light provided from the light emitting device ED (see FIG. 4A) or transmits the light.

Figure 3:
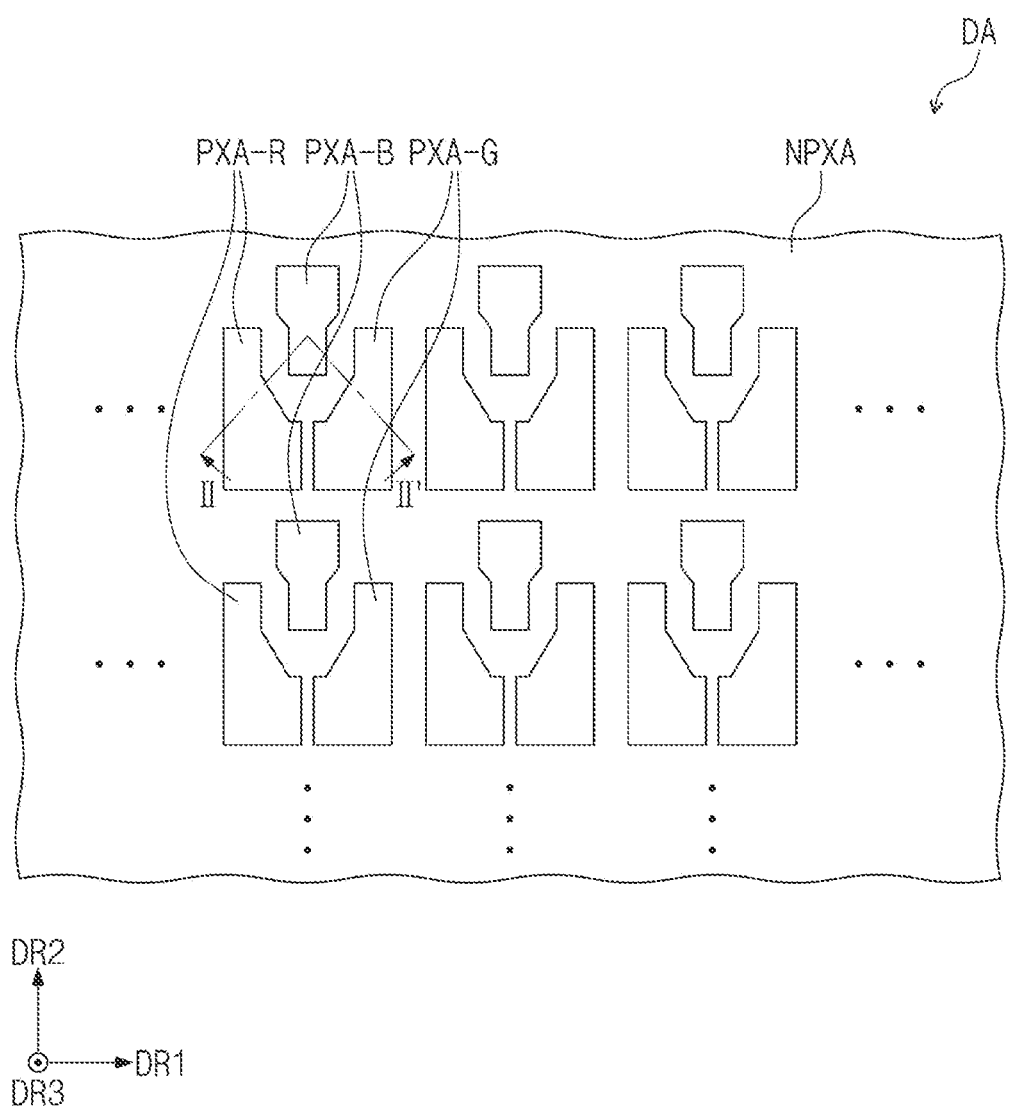
FIG. 3 is a plan view illustrating an enlarged portion of a display panel included in a display device according to an embodiment.
Figure 4A:
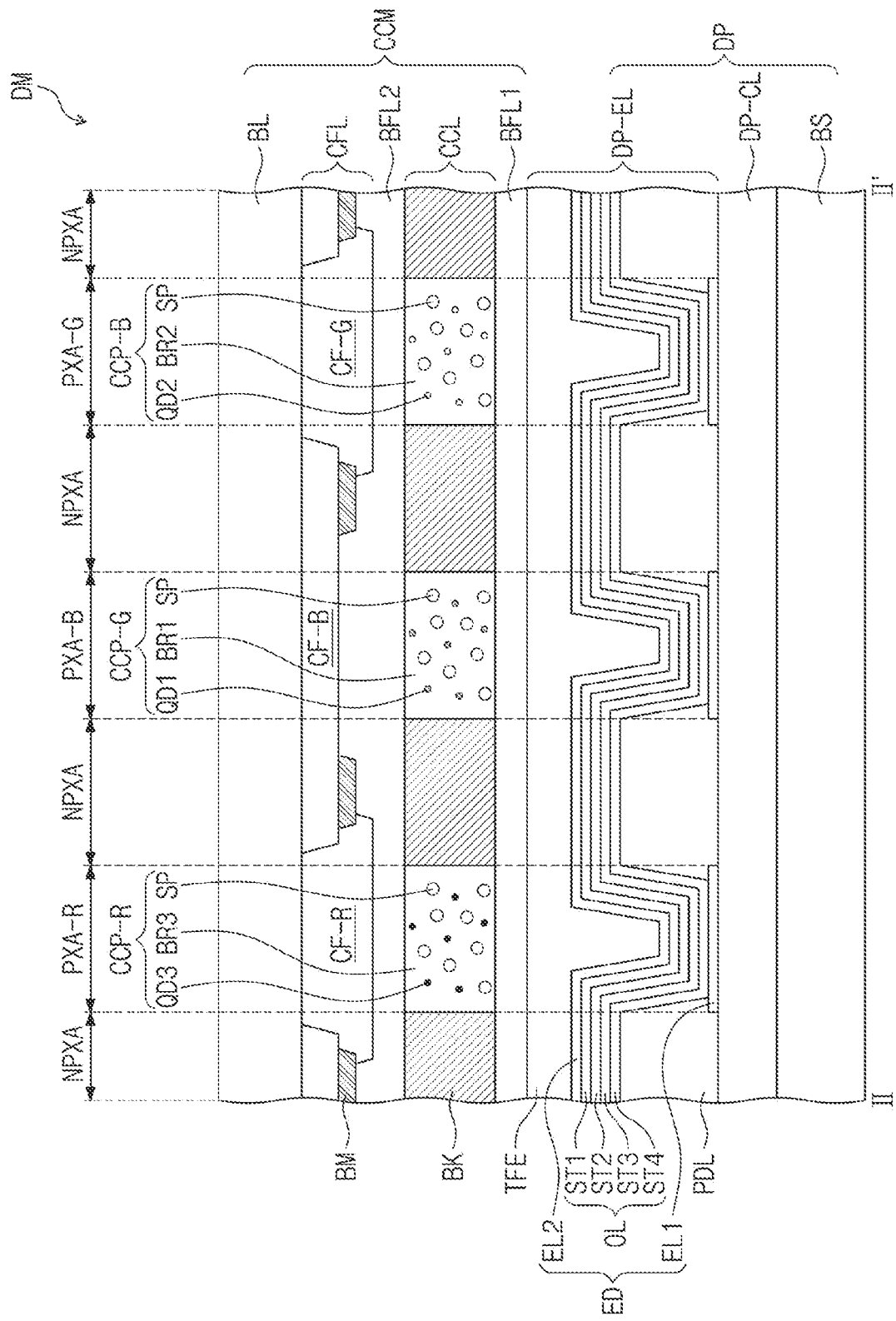
FIG. 4A and FIG. 4B are cross-sectional views illustrating an enlarged portion of a display module included in a display device according to an embodiment.
Figure 4B:
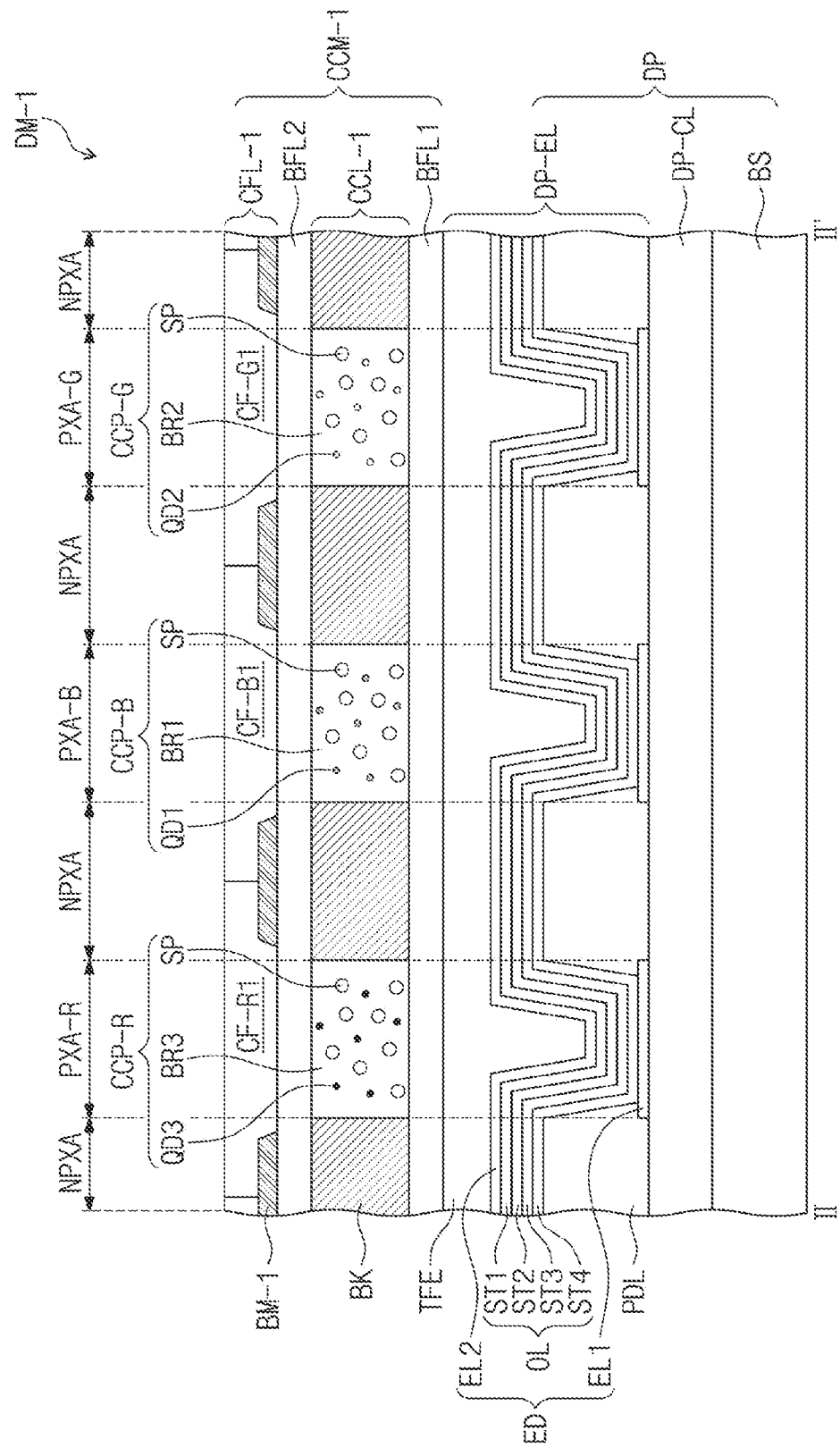

FIG. 3 is a plan view illustrating an enlarged portion of a display panel included in a display device according to an embodiment of the present disclosure. FIG. 4A and FIG. 4B are cross-sectional views illustrating an enlarged portion of a display module included in a display device according to an embodiment of the present disclosure. FIG. 3 illustrates a portion of the display region DA in a display panel according to an embodiment of the present disclosure. FIG. 4A and FIG. 4B illustrate a portion corresponding to line II-II' of FIG. 3.

Hereinafter, display modules DM and DM-1 of an embodiment to be described with reference to FIG. 4A and FIG. 4B are included in the display device ES of an embodiment described with reference to FIG. 1, and the display modules DM and DM-1 include the display panel DP and the light control member CCM.

The display module DM according to an embodiment may include the display panel DP and the light control member CCM on the display panel DP, and the light control member CCM may include the light control layer CCL and the color filter layer CFL. The light control member CCM may include the upper base layer BL, the light control layer CCL on a lower side of the upper base layer BL, and the color filter layer CFL between the light control layer CCL and the upper base layer BL. In the light control member CCM, the light control layer CCL may be disposed adjacent to the display panel DP.

The light control member CCM may include a plurality of partition walls BK and light control units CCP-R, CCP-B, and CCP-G between the partition walls BK.

Referring to FIG. 3, FIG. 4A, and FIG. 4B, the display module DM may include a non-pixel region NPXA and pixel regions PXA-R, PXA-B, and PXA-G. Each of the pixel regions PXA-R, PXA-B, and PXA-G may be a region in which light generated from the light emitting device ED is emitted. The area of each of the pixel regions PXA-R, PXA-B, and PXA-G may be different from each other, wherein the area may be an area when viewed on a plane.

The pixel regions PXA-R, PXA-B, and PXA-G may be classified into a plurality of groups according to the color of light generated. In the display module DM of an embodiment illustrated in FIG. 3, FIG. 4A, and FIG. 4B, three pixel regions PXA-R, p PXA-B, and PXA-G which respectively emit red light, blue light, and green light are illustrated. For example, the display device ES of an embodiment (see FIG. 1) may include a red pixel region PXA-R, a blue pixel region PXA-B, and a green pixel region PXA-G separated from each other. The blue pixel region PXA-B is a first pixel region and may emit light having a light emission wavelength of 410 nm to 480 nm. The green pixel region PXA-G is a second pixel region and may emit light having a light emission wavelength of 500 nm to 600 nm. The red pixel region PXA-R is a third pixel region and may emit light having a light emission wavelength of 620 nm to 700 nm.

In the display modules DM and DM-1 of an embodiment illustrated in FIG. 4A and FIG. 4B, the display panel DP is illustrated as including the light emitting device ED which includes an organic layer OL as a common layer. For example, in the display modules DM and DM-1 of an embodiment in accordance with FIG. 4A and FIG. 4B, the display panel DP may emit the same (substantially the same) light regardless of the pixel regions PXA-R, PXA-B, and PXA-G of the display module DM. For example, the display panel DP may provide blue light, which is the first light, to the light control member CCM. In some embodiments, the display panel DP may provide white light as the first light to the light control member CCM.

In the display modules DM and DM-1 of an embodiment illustrated in FIG. 3, FIG. 4A, and FIG. 4B, the red pixel region PXA-R and the green pixel region PXA-G among the pixel regions PXA-R, PXA-B, and PXA-G may have the same area, and the blue pixel region PXA-B may have a smaller area than the red pixel region PXA-R and the green pixel region PXA-G. However, embodiments of the present disclosure are not limited thereto. Each of the pixel regions PXA-R, PXA-B, and PXA-G may have the same area, or may have various suitable areas depending on colors emitted from the light control units CCP-R, CCP-B, and CCP-G. For example, in the display module DM of an embodiment, the blue pixel region PXA-B may have the largest area, and the green pixel region PXA-G may have the smallest area. However, embodiments of the present disclosure are not limited thereto. The pixel regions PXA-R, PXA-B, and PXA-G may emit lights of colors other than red light, blue light, and green light, or the pixel regions PXA-R, PXA-B, and PXA-G may be provided at different area ratios.

Each of the light pixel regions PXA-R, PXA-B, and PXA-G may be a region separated by a pixel definition film PDL. Non-pixel regions NPXA may be regions between adjacent pixel emitting regions PXA-R, PXA-B, and PXA-G, and may be a region corresponding to the pixel definition film PDL.

As illustrated in FIG. 3, the red pixel region PXA-R and the green pixel region PXA-G among the pixel regions PXA-R, PXA-B, and PXA-G may have symmetrical shapes with respect to a reference axis extending in the second direction DR2, and the blue pixel region PXA-B may be between the red pixel region PXA-R and the green pixel region PXA-G. When viewed in the first direction DR1, a portion of the blue pixel region PXA-B may not overlap the red pixel region PXA-R and the green pixel region PXA-G. However, embodiments of the present disclosure are not limited to. The pixel regions PXA-R, PXA-B, and PXA-G may have various suitable polygonal shapes or circular shapes, and the arrangement structure of the pixel regions is not limited thereto. For example, the pixel regions may have a stripe structure in which the blue pixel region PXA-B, the green pixel region PXA-G, and the red pixel region PXA-R are sequentially and alternately arranged, or the arrangement structure of the pixel regions PXA-R, PXA-B, and PXA-G may be a PENTILE® arrangement (for example, an RGBG matrix, an RGBG structure, or RGBG matrix structure) but structure. PENTILE® is a duly registered trademark of Samsung Display Co., Ltd.

Referring to FIG. 4A and FIG. 4B, the display panel DP according to an embodiment may include the base substrate BS, the circuit layer DP-CL on the base substrate BS, and the display element layer DP-EL on the circuit layer DP-CL. The display element layer DP-EL may include the pixel definition film PDL, the light emitting device ED between the pixel definition film PDL, and a thin film encapsulation layer TFE on the light emitting device ED.

The pixel definition film PDL may be formed of a polymer resin. For example, the pixel definition film PDL may be formed by including a polyacrylate-based resin or a polyimide-based resin. Also, the pixel definition film PDL may be formed by further including an inorganic matter in addition to the polymer resin. In some embodiments, the pixel definition film PDL may be formed by including a light absorbing material, or may be formed by including a black pigment or a black dye. Also, the pixel definition film PDL may be formed of an inorganic matter. For example, the pixel definition film PDL may be formed by including silicon nitride ($SiN_x$), silicon oxide ($SiO_x$), silicon oxynitride ($SiO_xN_y$), and/or the like. The pixel definition film PDL may define the pixel regions PXA-R, PXA-B, and PXA-G. The pixel regions PXA-R, PXA-B, and PXA-G and the non-pixel region NPXA may be separated by the pixel definition film PDL.

The pixel definition film PDL may overlap the partition wall BK. For example, each of the plurality of pixel definition films PDL may correspond to and overlap each of the plurality of partition walls BK.

The light emitting device ED may include a first electrode EU and a second electrode EL2 facing each other, and a plurality of organic layers OL between the first electrode EL1 and the second electrode EL2. The organic layer OL of the light emitting device ED may include a plurality of stacks ST1, ST2, ST3, and ST4. Each of the stacks ST1, ST2, ST3, and ST4 may include functional layers including a hole transport material and an electron transport material, and light emitting layers including a light emitting material. In some embodiments, the light emitting device ED included in the display module DM of an embodiment may be a light emitting device of a tandem structure including a plurality of light emitting layers. Hereinafter, each of the functional layers and the light emitting layers included in the light emitting device ED will be described in the disclosure below.

FIG. 4A and FIG. 4B illustrate an embodiment in which each of the plurality of stacks ST1, ST2, ST3, and ST4 included in the organic layer OL is provided as a common layer throughout the pixel regions PXA-R, PXA-B, and PXA-G and the non-pixel region NPXA. For example, a portion of each of the plurality of stacks ST1, ST2, ST3, and ST4 included in the light emitting device ED may be on the pixel definition film PDL, and portions of the plurality of stacks ST1, ST2, ST3, and ST4 in the pixel regions PXA-R, PXA-B, and PXA-G may be connected (coupled) to each other on the pixel definition film PDL to form common layers having an integral shape. Accordingly, each of the functional layers and the light emitting layers in the plurality of stacks ST1, ST2, ST3, and ST4 may also form common layers having an integral shape throughout the pixel regions PXA-R, PXA-B, and PXA-G and the non-pixel region NPXA. However, embodiments of the present disclosure are not limited thereto. Different from what is illustrated in FIG. 4A and FIG. 4B, in an embodiment, at least a portion of the plurality of stacks ST1, ST2, ST3, and ST4 may be patterned and provided inside openings defined on the pixel definition film PDL. At least a portion of the plurality of stacks ST1, ST2, ST3, and ST4, or at least a portion of the functional layers and the light emitting layers included in the plurality of stacks ST1, ST2, ST3, and ST4 may be patterned by an ink-jet printing method and provided inside an opening of the pixel definition film PDL which is defined to overlap the pixel regions PXA-R, PXA-B, and PXA-G.

The thin film encapsulation layer TFE may be on the light emitting device ED, and the thin film encapsulation layer TFE may be on the second electrode EL2. The thin film encapsulation layer TFE may be directly on the second electrode EL2. The thin film encapsulation layer TFE may be a single layer, or a plurality of layers stacked. The thin film encapsulation layer TFE includes at least one insulation layer. The thin film encapsulation layer TFE according to an embodiment may include at least one inorganic film (hereinafter, an encapsulation inorganic film). In addition, the thin film encapsulation layer TFE according to an embodiment may include at least one organic film (hereinafter, an encapsulation organic film) and at least one encapsulation inorganic film.

The encapsulation inorganic film protects the light emitting device ED from moisture/oxygen, and the encapsulation organic film protects the light emitting device ED from foreign matters such as dust particles. The encapsulation inorganic film may include silicon nitride, silicon oxynitride, silicon oxide, titanium oxide, aluminum oxide, and/or the like, but is not particularly limited thereto. The encapsulation organic film may include an acrylic compound, an epoxy-based compound, and/or the like. The encapsulation organic film may include a photopolymerizable organic material, but is not particularly limited thereto.

A display device according to an embodiment includes the light control member CCM on a display panel. The light control member CCM includes the upper base layer BL, and the light control layer CCL on a lower side of the upper base layer BL. The light control member CCL may include the plurality of partition walls BK spaced apart from each other and the light control units CCP-R, CCP-B, and CCP-G between the partition walls BK. For example, the light control member CCL according to an embodiment may include the upper base layer BL, the plurality of partition walls BK on the upper base layer BL, and the light control units CCP-R, CCP-B, and CCP-G between the plurality of partition walls BK spaced apart from each other. FIG. 3 illustrates that the upper base layer BL which provides a reference surface on which the light control layer CCL is separately provided, but embodiments of the present disclosure are not limited thereto. The light control layer CCL may be on a reference surface provided by the thin film encapsulation layer TFE of the display element layer DP-EL.

The light control member CCM of an embodiment may include the plurality of light control units CCP-R, CCP-B, and CCP-G. The light control units CCP-R, CCP-B, and CCP-G may include a first light control unit CCP-B configured to transmit light of a first wavelength, a second light control unit CCP-G configured to convert the light of the first wavelength to light of a second wavelength, and a third light control unit CCP-R configured to convert the light of the first wavelength or the light of the second wavelength to light of a third wavelength. The light of the second wavelength may be the light of a longer wavelength region than the light of the first wavelength, and the light of the third wavelength may be light of a longer wavelength region than the light of the first wavelength and the light of the second wavelength. For example, the light of the first wavelength may be blue light, the light of the second wavelength may be green light, and the light of the third wavelength may be red light. The light of the first wavelength may be light having a light emission wavelength of 410 nm to 480 nm, the light of the second wavelength may be light having a light emission wavelength of 500 nm to 600 nm, and the light of the third wavelength may be light having a light emission wavelength of 620 nm to 700 nm. In some embodiments, the light of the first wavelength and/or the second wavelength may be source light provided from the display panel DP to the light control layer CCL.

Each of a first light control unit CCP-B, a second light control unit CCP-G, and a third light control unit CCP-R may include a light emitting body. The light emitting body may be a particle which converts the wavelength of incident light to emit light of a different wavelength. In an embodiment, a light emitting body included in the second light control unit CCP-G and the third light control unit CCP-R may be a quantum dot or a fluorescent body. For example, the second light control unit CCP-G may include a quantum dot QD2 configured to convert light of the first wavelength to light of the second wavelength, and the third light control unit CCP-R may include a quantum dot QD3 configured to convert the light of the first wavelength or the light of the second wavelength to light of the third wavelength. In some embodiments, the first light control unit CCP-B may not include a light emitting body such as a quantum dot. The first light control unit CCP-B may be a transmissive unit configured to transmit the light of the first wavelength. However, embodiments of the present disclosure are not limited thereto. The first light control unit CCP-B may include a quantum dot QD1 configured to convert the light of the second wavelength to the light of the first wavelength.

A quantum dot may be a particle configured to convert the wavelength of provided light. A core of a quantum dot may be selected from a Group II-VI compound, a Group III-VIIII-V compound, a Group compound, a Group III-V compound, a Group III-II-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$, $In_2Se_3$, and/or the like, a ternary compound such as $InGaS_3$, $InGaSe_3$, and/or the like, or any combination thereof.

The Group I-III-VI compound may be selected from the group consisting of a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and a mixture thereof, and a quaternary compound such as $AgInGaS_2$, $CuInGaS_2$, and the like.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. Meanwhile, The Group III-V compound may further include a Group II metal. For example, InZnP or the like may be selected as the Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnالسTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In some embodiments, a binary compound, a ternary compound, or a quaternary compound may be present in a particle with a uniform (substantially uniform) concentration distribution, or may be present in the same particle with a partially non-uniform concentration. In addition, a quantum dot may have a core/shell structure in which one quantum dot surrounds another quantum dot. In the core/shell structure, a binary compound, a ternary compound, or a quaternary compound may have a concentration gradient in which the concentration of an element present in the shell becomes lower along a direction toward the center of the core.

In some embodiments, a quantum dot may have a core-shell structure including a core having nano-crystals and a shell surrounding the core which are described above. The shell of the quantum dot may serve as a protection layer to prevent (decrease) the chemical deformation of the core so as to maintain semiconductor properties, and/or a charging layer to impart electrophoresis properties to the quantum dot. The shell may be a single layer or multiple layers. An example of the shell of the quantum dot may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$. However, embodiments of the present disclosure are not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like. However, embodiments of the present disclosure are not limited thereto.

A quantum dot may have a full width of half maximum (FWHM) of a light emission wavelength spectrum of about 45 nm or less, for example about 40 nm or less, or about 30 nm or less, and color purity or color reproducibility may be improved in the above range. In addition, light emitted through such a quantum dot is emitted in all directions so that a wide viewing angle may be improved (increased).

In addition, the form of a quantum dot is not limited as long as it is a form used in the art, a quantum dot in the form of, for example, spherical, pyramidal, multi-arm, and/or cubic nanoparticles, nanotubes, nanowires, nanofibers, nanoparticles, and the like may be used.

A quantum dot may control the color of emitted light according to the particle size thereof. Accordingly, the quantum dot may have various suitable light emission colors such as blue, red, green, and/or the like.

A quantum dot may control the color of emitted light according to the particle size thereof. Accordingly, the quantum dot may have various light emission colors such as blue, red, green, and the like. The smaller the particle size of a quantum dot, light of the shorter wavelength region may be emitted. For example, the particle size of a quantum dot emitting green light may be smaller than the particle size of a quantum dot emitting red light, and the particle size of a quantum dot emitting blue light may be smaller than the particle size of the quantum dot emitting green light.

Each of the plurality of light control units CCP-R, CCP-B, and CCP-G included in the light control layer CCL may further include a scattering body SP. The first light control unit CCP-B may include the first quantum dot QD1 and the scattering body SP, the second light control unit CCP-G may include the second quantum dot QD2 and the scattering body SP, and the third light control unit CCP-R may include the third quantum dot QD3 and the scattering body SP. However, embodiments of the present disclosure are not limited thereto. In the first light control unit CCP-B, the first quantum dot QD1 may be omitted, and the first light control unit CCP-B may only include the scattering body SP.

The scattering body SP may be an inorganic particle. For example, the scattering body SP may include at least one material from $TiO_2$, ZnO, $Al_2O_3$, $SiO_2$, or hollow silica. The scattering body SP may include any material of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

Each of the first light control unit CCP-B, the second light control unit CCP-G, and the third light control unit CCP-R may further include base resins BR1, BR2, and BR3 which disperse the quantum dots QD1, QD2, and QD3 and/or the scattering body SP. In an embodiment, the first light control unit CCP-B may include the first quantum dot QD1 and the scattering body SP dispersed in a first base resin BR1, the second light control unit CCP-G may include the second quantum dot QD2 and the scattering body SP dispersed in a second base resin BR2, and the third light control unit CCP-R may include the third quantum dot QD3 and the scattering body SP dispersed in the third base resin BR3. The base resins BR1, BR2, and BR3 are media in which the quantum dots QD1, QD2, and QD3 and the scattering body SP are dispersed, and may be formed of various suitable resin compositions which may be generally referred to as a binder. For example, the base resins BR1, BR2, and BR3 may each be an acrylic resin, a urethane-based resin, a silicone-based resin, an epoxy resin, or the like. The base resins BR1, BR2, and BR3 may each be a transparent resin. In an embodiment, the first base resin BR1, the second base resin BR2, and the third base resin BR3 may be the same (substantially the same) or different from each other.

The partition walls BK may define an opening which distinguishes each of the pixel regions PXA-R, PXA-B, and PXA-G overlapping the light control layer CCL. The light control units CCP-R, CCP-B, and CCP-G may fill the opening defined on the partition walls BK. For example, the partition walls BK may be formed by including a light absorbing material, or may be formed by including a black pigment or a black dye.

The light control member CCM according to an embodiment may further include the color filter layer CFL. The color filter layer CFL may be between the upper base layer BL and the light control layer CCL. The color filter layer CFL may include a light blocking part BM and filters CF-B, CF-G, and CF-R. The color filter layer CFL may include a first filter CF-B configured to transmit the light of the first wavelength, a second filter CF-G configured to transmit the light of the second wavelength, and a third filter CF-R configured to transmit the light of the third wavelength. For example, the first filter CF-B may be a blue filter, the second filter CF-G may be a green filter, and the third filter CF-R may be a red filter. Each of the filters CF-B, CF-G, and CF-R may include a polymer photosensitive resin and a pigment and/or a dye. The first filter CF-B may include a blue pigment or a blue dye, the second filter CF-G may include a green pigment or a green dye, and the third filter CF-R may include a red pigment or a red dye. However, embodiments of the present disclosure are not limited thereto. The first filter CF-B may not include a pigment or a dye. The first filter CF-B may include a polymer photosensitive resin, but not a pigment or a dye. The first filter CF-B may be transparent. The first filter CF-B may be formed of a transparent photosensitive resin.

In addition, in an embodiment, the second filter CF-G and the third filter CF-R may be a yellow filter. The second filter CF-G and the third filter CF-R may be provided as one body without being distinguished from each other.

The light blocking part BM may be a black matrix. The light blocking part BM may be formed by including an organic light blocking material or an inorganic light blocking material, both materials including a black pigment or a black dye. The light blocking part BM may prevent (reduce) a light leakage phenomenon and distinguish boundaries between adjacent filters CF-B, CF-G, and CF-R. In addition, in an embodiment, the light blocking part BM may be formed of a blue filter. In some embodiments, each of a plurality of light blocking part BM may correspond to and overlap each of the plurality of partition walls BK.

Each of the three filters CF-B, CF-G, and CF-R may be positioned corresponding to the blue pixel region PXA-B, the green pixel region PXA-G, and the red pixel region PXA-R, respectively.

The upper base layer BL may be on the color filter layer CFL. The upper base layer BL may be a member which provides a base surface on which the color filter layer CFL, the light control layer CCL, and the like are disposed. The upper base layer BL may be a glass substrate, a metal substrate, a plastic substrate, and/or the like. However, embodiments of the present disclosure are not limited thereto, and the upper base layer BL may be an inorganic layer, an organic layer, and/or a composite material layer. In addition, in an embodiment, the upper base layer BL may be omitted.

The color filter layer CFL may further include a low refractive layer. The low refraction layer may be between the filters CF-B, CF-G, and CF-R and the light control layer CCL. The refractive index of the low refractive layer may be 1.1 to 1.5. A refractive index value of the low refraction layer may be adjusted by the ratio of hollow inorganic particles, and/or voids included in the low refractive layer.

The display module DM may further include a reflection prevention layer in an upper portion or lower portion of the color filter layer CFL and blocking external light incident on the display module DM. The reflection prevention layer may block (decrease) a portion of external light. The reflection prevention layer may reduce reflection light generated in the display panel DP due to external light. The reflection prevention layer may be, for example, a polarizing layer. In an embodiment, the display module DM includes a polarizing layer in a lower portion of the upper base layer BL, and the color filter layer CFL may be omitted.

The light control member CCM may further include buffer layers BFL1 and BFL2 which block (decrease) moisture, oxygen, and the like, and protect components in an upper portion and a lower portion of the buffer layers BFL1 and BFL2. The buffer layers BFL1 and BFL2 may include a first buffer layer BFL1 and a second buffer layer BFL2. The first buffer layer BFL1 may be between the thin film encapsulation layer TFE and the light control layer CCL. The second buffer layer BFL2 may be between the light control layer CCL and the color filter layer CFL.

The first buffer layer BFL1 may be a layer which serves to prevent (decrease) the penetration of moisture and/or oxygen (hereinafter, referred to as 'moisture/oxygen') into the light control layer CCL. The first buffer layer BFL1 may be in a lower portion of the light control layer CCL to prevent the light control layer CCL from being exposed to moisture/oxygen. The first buffer layer BFL1 may include at least one inorganic layer. For example, the first buffer layer BFL1 may be formed by including an inorganic material. For example, the first buffer layer BFL1 may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride, or a thin metal film having light transmittance, and/or the like. Meanwhile, the first buffer layer BFL1 may further include an organic film. The first buffer layer BFL1 may be composed of a single layer or a plurality of layers.

The second buffer layer BFL2 may be a protection layer which protects the light control layer CCL and the color filter layer CFL. The second buffer layer BFL2 may be an inorganic material layer including at least one inorganic material selected from silicon nitride, silicon oxide, and silicon oxynitride. The second buffer layer BFL2 may be composed of a single layer or a plurality of layers.

Referring to FIG. 4B, a display module DM-1 according to an embodiment may include a display panel DP, and a light control member CCM-1 on the display panel DP, and the light control member CCM-1 may include a light control layer CCL-1 and a color filter layer CFL-1. In the display module DM-1 of an embodiment, the light control layer CCL-1 may be on the display panel DP. The light control layer CCL-1 may be on the display panel DP having the first buffer layer BFL1 interposed therebetween.

The light control layer CCL-1 of the light control member CCM-1 may include a plurality of partition walls BK and light control units CCP-R, CCP-B, and CCP-G between the partition walls BK. The color filter layer CFL-1 may include a light blocking part BM-1 and filters CF-R1, CF-B1, and CF-G1.

Compared to the display module DM illustrated in FIG. 4A, the display module DM-1 according to an embodiment illustrated in FIG. 4B is an embodiment in which the upper base layer BL is omitted, and the light control layer CCL-1 and the color filter layer CFL-1 have an upper surface of a thin film encapsulation layer TFE as a base surface. In some embodiments, the light control units CCP-R, CCP-B, and CCP-G of the light control layer CCL-1 may be formed on the display panel DP by a continuous process, and the filters CF-R1, CF-B1, and CF-G1 of the color filter layer CFL-1 may be sequentially formed on the light control layer CCL-1 through a continuous process.

In some embodiments, the color filter layer CFL-1 may include a low refractive layer. A portion of the light blocking part BM-1 and the filters CF-R1, CF-B1, and CF-G1 included in the color filter layer CFL-1 may be omitted. The light control member CCM-1 may further include buffer layers BFL1 and BFL2 which block (decrease) moisture, oxygen, and the like, and protect components in an upper portion and a lower portion of the buffer layers BFL1 and BFL2. The buffer layers BFL1 and BFL2 may include a first buffer layer BFL1 between the thin film encapsulation layer TFE and the light control layer CCL, and a second buffer layer BFL2 between the light control layer CCL and the color filter layer CFL.

FIG. 5 and FIG. 6A to FIG. 6C are cross-sectional views schematically showing a light emitting device according to an embodiment of the present disclosure. Hereinafter, referring to FIG. 5 and FIG. 6A to FIG. 6C, light emitting devices ED, ED-1, ED-2, and ED-3 according to an embodiment of the present disclosure will be described below.

Figure 5:
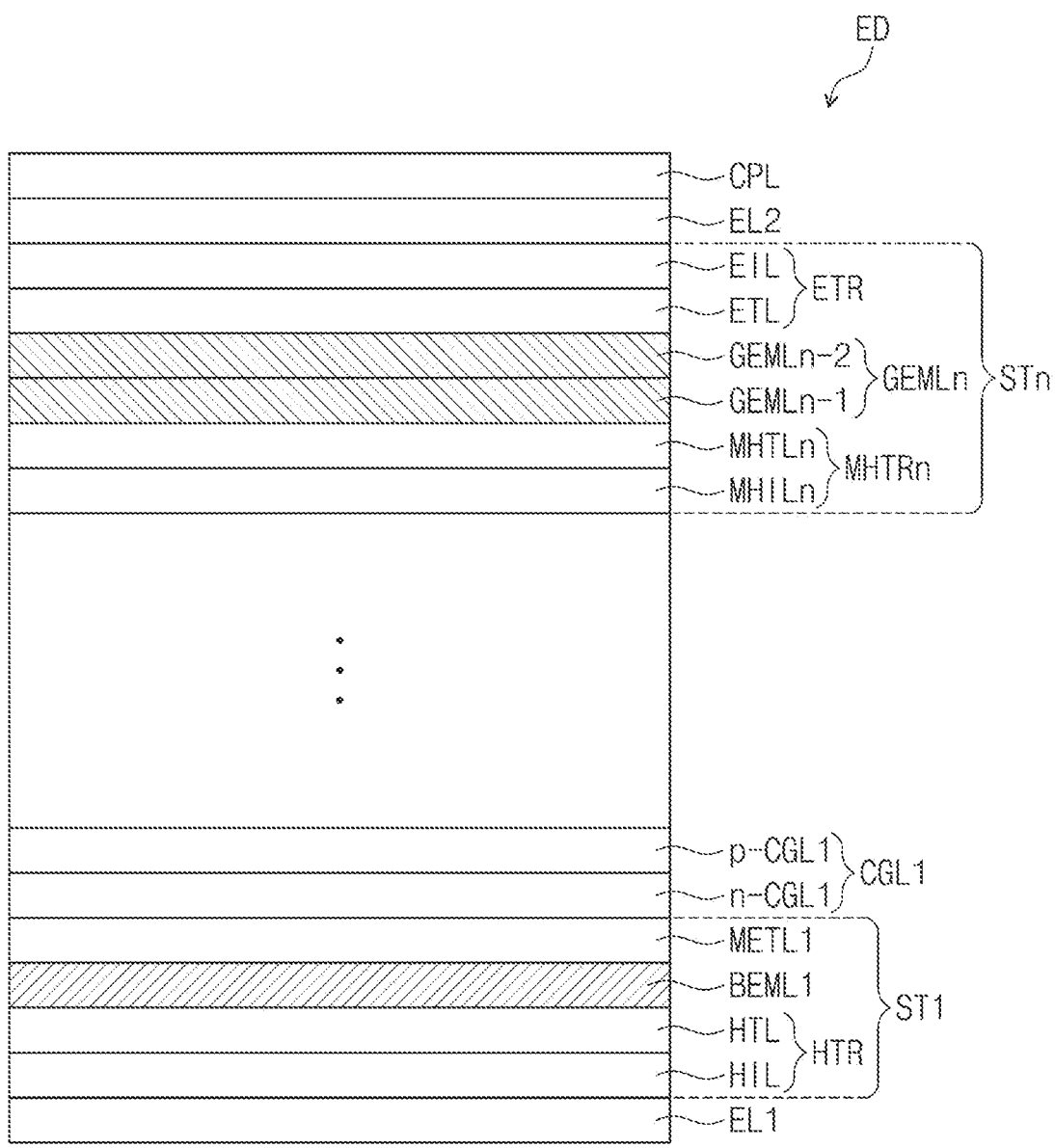
FIG. 5 is a cross-sectional view schematically showing a light emitting device according to an embodiment.

Referring to FIG. 5, the light emitting device ED may include the first electrode EL1, the second electrode EL2, and n number of stacks ST1 to STn between the first electrode EL1 and the second electrode EL2, wherein n may be an integer of 2 or greater. In some embodiments, the light emitting device ED may include at least two stacks, and may include, for example, two stacks, three stacks, or 4 or more stacks.

The light emitting device ED of an embodiment must include at least a stack ST1 including a first light emitting layer BEML1 and a stack STn including a second light emitting layer GEMLn. In the present disclosure, the first light emitting layer BEML1 may be a light emitting layer which emits the light of the first wavelength, and the second light emitting layer GEMLn may be a light emitting layer which emits light of the second wavelength. Numbers 1 and n after the reference letters of the first light emitting layer BEML1 and the second light emitting layer GEMLn indicate in which stack each light emitting layer is included. The light emitting device ED of an embodiment may include a stack including the first light emitting layer BEML1 and/or a stack including the second light emitting layer GEMLn. FIG. 5 illustrates that the first light emitting layer BEML1 is included in a first stack and the second light emitting layer GEMLn is included in an n-th stack. However, the order of each stack is not limited thereto.

A charge generation layer CGL1 may be between adjacent stacks among the plurality of stacks ST1 to STn. The charge generation layer CGL1 may include a p-type charge generation layer p-CGL1 and/or an n-type charge generation layer n-CGL1. The charge generation layer CGL may promote the movement of holes and/or charges.

Hereinafter, referring to FIG. 6A to FIG. 6D, the light emitting device ED of an example which includes 4 stacks will be described in more detail.

Figure 6A:
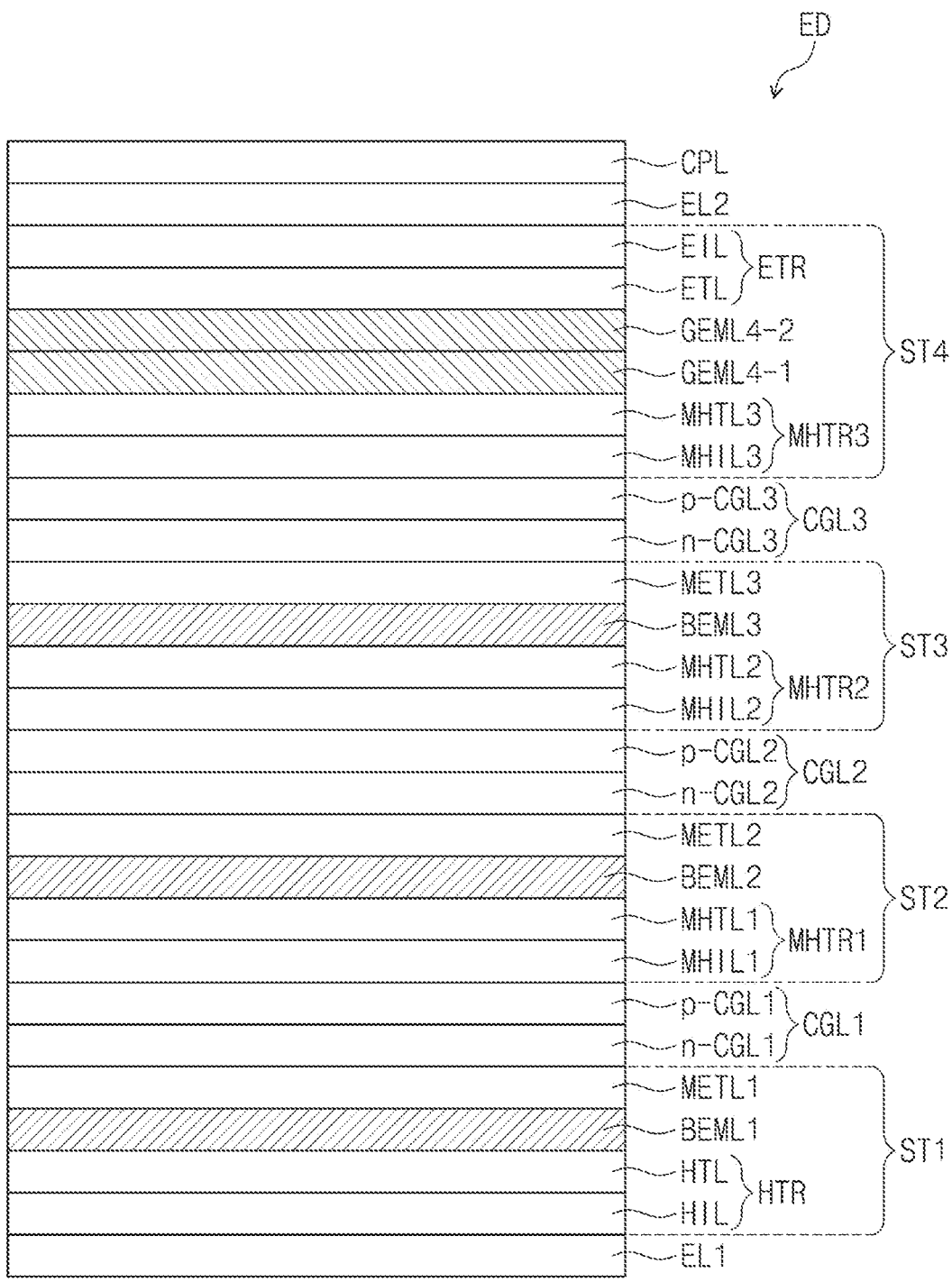
FIG. 6A to FIG. 6C are cross-sectional views schematically showing a light emitting device according to an embodiment.

Referring to FIG. 6A, the light emitting device ED of an embodiment includes the first electrode EL1, the second electrode EL2 facing the first electrode EL1, and a plurality of stacks ST1, ST2, ST3, and ST4 between the first electrode EL1 and the second electrode EL2. The plurality of stacks ST1, ST2, ST3, and ST4 may include a first stack ST1, a second stack ST2, a third stack ST3, and a fourth stack ST4. Each of the first stack ST1, the second stack ST2, the third stack ST3, and the fourth stack ST4 may include a light emitting layer. FIG. 6A illustrates that the light emitting device ED includes a total of four stacks ST1, ST2, ST3, and ST4. However, embodiments of the present disclosure are not limited thereto. The light emitting device ED may include two, three, or five or more stacks. For example, in the light emitting device ED structure illustrated in FIG. 6A, the second stack ST2 and the third stack ST3 may be omitted, and a light emitting device structure having the first stack ST1 and the fourth stack ST4 may be provided.

In the light emitting device ED of an embodiment, between the first electrode EL1 and the plurality of stacks ST1, ST2, ST3, and ST4, a hole transport region HTR may be disposed. Between the second electrode EL2 and the plurality of stacks ST1, ST2, ST3, and ST4, an electron transport region ETR may be disposed. In an embodiment, the light emitting element ED may emit light in the direction from the first electrode EL1 to the second electrode EL2. The light emitting device ED of an embodiment may have a structure in which, based on a direction in which light is emitted, the hole transport region HTR is in a lower portion of the plurality of stacks ST1, ST2, ST3, and ST4 and the electron transport region ETR is in an upper portion of the plurality of stacks ST1, ST2, ST3, and ST4. However, embodiments of the present disclosure are not limited thereto, and the light emitting device ED may have an inverted device structure in which, based on a direction in which light is emitted, the electron transport region ETR is in a lower portion of the plurality of stacks ST1, ST2, ST3, and ST4 and the hole transport region HTR is in an upper portion of the plurality of stacks ST1, ST2, ST3, and ST4.

The light emitting device ED according to an embodiment may include charge generation layers CGL1, CGL2, and CGL3 between the plurality of stacks ST1, ST2, ST3, and ST4. The light emitting device ED according to an embodiment may include a first charge generation layer CGL1 between the first stack ST1 and the second stack ST2, a second charge generation layer CGL2 between the second stack ST2 and the third stack ST3, a third charge generation layer CGL3 between the third stack ST3 and the fourth stack ST4.

When a voltage is applied, the charge generation layers CGL1, CGL2, and CGL3 may generate charges (electrons and holes) by forming a complex through an oxidation-reduction reaction. Then, the charge generation layers CGL1, CGL2, and CGL3 may, respectively, provide the generated charges to adjacent stacks ST1, ST2, ST3 and ST4. The charge generation layers CGL1, CGL2, and CGL3 may double the efficiency of a current generated in each of the stacks ST1, ST2, ST3, and ST4, and may serve to control the balance of charges between adjacent stacks ST1, ST2, ST3 and ST4.

Each of the charge generation layers CGL1, CGL2, and CGL3 may have a layered structure in which n-type charge generation layers n-CGL1, n-CGL2, and n-CGL3 and p-type charge generation layers p-CGL1, p-CGL2, and p-CGL3 are bonded to each other. The first charge generation layer CGL1 may have a layered structure in which a first n-type charge generation layer n-CGL1 and a first p-type charge generation layer p-CGL1 are bonded to each other. The second charge generation layer CGL2 may have a layered structure in which a second n-type charge generation layer n-CGL2 and a second p-type charge generation layer p-CGL2 are bonded to each other. The third charge generation layer CGL3 may have a layered structure in which a third n-type charge generation layer n-CGL3 and a third p-type charge generation layer p-CGL3 are bonded to each other.

The n-type charge generation layers n-CGL1, n-CGL2, and n-CGL3 may be charge generation layers which provide electrons to adjacent stacks. The n-type charge generation layers n-CGL1, n-CGL2, and n-CGL3 may be layers in which a base material is doped with an n-dopant. The p-type charge generation layers p-CGL1, p-CGL2, and p-CGL3 may be charge generation layers which provide holes to adjacent stacks. In some embodiments, a buffer layer may be further disposed between the n-type charge generation layers n-CGL1, n-CGL2, and n-CGL3 and the p-type charge generation layers p-CGL1, p-CGL2, and p-CGL3.

Each of the charge generation layers CGL1, CGL2, and CGL3 may include an n-type aryl amine-based material, and/or a p-type metal oxide. For example, each of the charge generation layers CGL1, CGL2, and CGL3 may include an aryl amine-based organic compound, a metal, a metal oxide, a carbide, a fluoride, and/or a charge generation compound consisting of a mixture thereof.

For example, the aryl amine-based organic compound may be α-NPD, 2-TNATA, TDATA, MTDATA, spiro-TAD, and/or spiro-NPB. For example, the metal may be cesium (Cs), molybdenum (Mo), vanadium (V), titanium (Ti), tungsten (W), barium (Ba), and/or lithium (Li). In addition, for example, the metal oxide, the carbide, and the fluoride may be $Re_2O_7$, $MoO_3$, $V_2O_5$, $WO_3$, $TiO_2$, $Cs_2CO_3$, BaF, LiF, and/or CsF.

In the light emitting device ED according to an embodiment, each of the first stack ST1, the second stack ST2, and the third stack ST3 includes first light emitting layers BEML1, BEML2, and BEML3 which emit the light of the first wavelength. The light of the first wavelength may be light of a blue wavelength region. In an embodiment, the first wavelength may be 420 nm to 480 nm. The first light emitting layers BEML1, BEML2, and BEML3 may include an organic material which emits light having a wavelength of 420 nm to 480 nm. The first light emitting layers BEML1, BEML2, and BEML3 may include, for example, a host and a dopant.

The first light emitting layers BEML1, BEML2, and BEML3 have a single-layered structure. Unlike second light emitting layers GEML4-1 and GEML4-2, the first light emitting layers BEML1, BEML2, and BEML3 do not have a double-layered structure. The first light emitting layers BEML1, BEML2, and BEML3 having a single-layered structure may have a thickness of 10 nm to 40 nm, but are not limited thereto.

In the light emitting device ED according to an embodiment, the fourth stack ST4 includes the second light emitting layers GEML4-1 and GEML4-2 which emit the light of the second wavelength. The light of the second wavelength may be light of a green wavelength region. In an embodiment, the second wavelength may be 520 nm to 600 nm.

The second light emitting layers GEML4-1 and GEML4-2 have a double-layered structure which includes a first sub-light emitting layer GEML4-1 and a second sub-light emitting layer GEML4-2. The first sub-light emitting layer GEML4-1 and the second sub-light emitting layer GEML4-2 may be in contact with each other without having another layer interposed therebetween. The second sub-light emitting layer GEML4-2 may be directly on the first sub-light emitting layer GEML4-1.

In an embodiment, in the double-layered structure, one layer GEML4-1 (hereinafter, the first sub-light emitting layer) which is closer to a third intermediate hole transport region MHTR3 than GEML4-2 includes a first host and a dopant. The first host may include a first hole transporting host and a second electron transporting host. The dopant may emit the light of the second wavelength.

The other layer GEML4-2 (hereinafter, the second sub-light emitting layer) which is closer to the electron transport region ETR than GEML4-1 includes a second host and a second hole transporting host. The second host may include a third hole transporting host and a second electron transporting host. The third hole transporting host may be the same as the first hole transporting host. However, embodiments of the present disclosure are not limited thereto, and the third hole transporting host and the first hole transporting host may be different from each other. The second hole transporting host may be the same as the first hole transporting host. However, embodiments of the present disclosure are not limited thereto, and the second hole transporting host and the first hole transporting host may be different from each other.

In the present disclosure, the hole transporting host may be a material including a hole transporting moiety in its molecular structure. The electron transporting host may be a material including an electron transporting moiety in its molecular structure.

The second light emitting layers GEML4-1 and GEML4-2 may have a thickness of 10 nm to 30 nm. The first sub-light emitting layer GEML4-1 may have a thickness of 9 nm to 29 nm. The second sub-light emitting layer GEML4-2 may have a thickness of 1 nm to 15 nm. The first sub-light emitting layer GEML4-1 may be thicker than the second sub-light emitting layer GEML4-2. However, embodiments of the present disclosure are not limited thereto. The first sub-light emitting layer GEML4-1 and the second sub-light emitting layer GEML4-2 may have the same (substantially the same) thickness.

The first sub-light emitting layer GEML4-1 includes a first host material and a dopant, and the second sub-light emitting layer GEML4-2 includes the second host and the second hole transporting host. In some embodiments, the second sub-light emitting layer GEML4-2 does not include a dopant which emits the light of the second wavelength. The second light emitting layers GEML4-1 and GEML4-2 of the present disclosure do not include a dopant in a region adjacent to the electron transport region ETR but include the second sub-light emitting layer GEML4-2 having a high ratio of the hole transporting host, and the second sub-light emitting layer GEML4-2 may serve as an electron trap to prevent non-uniformity of charge balance, and improve (increase) light emitting efficiency.

In an embodiment, the first host included in the first sub-light emitting layer GEML4-1 may include the first hole transporting host and the first electron transporting host. The second host included in the second sub-light emitting layer GEML4-2 may include the third hole transporting host and the second electron transporting host. The first host and the second host may be the same material. For example, the first hole transporting host and the third hole transporting host may be identical to each other, and the first electron transporting host and the second electron transporting host may be the same material. However, embodiments of the present disclosure are not limited thereto. The first host and the second host may be different from each other. For example, the first hole transporting host and the third hole transporting host may be different from each other, and the first electron transporting host and the second electron transporting host may be different materials. In some embodiments, the first hole transporting host and the third hole transporting host may be different from each other, or the first electron transporting host and the second electron transporting host may be different materials.

In the light emitting device ED according to an embodiment, the first hole transporting host included in the first sub-light emitting layer GEML4-1 may have a higher lowest unoccupied molecular orbital (LUMO) energy level value than the first electron transporting host.

In the light emitting device ED according to an embodiment, the second hole transporting host included in the second sub-light emitting layer GEML4-2 may have a LUMO energy level value equal to or smaller than that of the first hole transporting host, and a LUMO energy level value larger than that of the first electron transporting host. For example, the upper limit of the LUMO energy level value that the second hole transporting host may have is the LUMO energy level value of the first hole transporting host, and the lower limit thereof may be an average value of the LUMO energy level of the first hole transporting host and the LUMO energy level of the first electron transporting host. For example, the LUMO energy level value of the second hole transporting host may be $-1.94$ eV to $-2.32$ eV.

In an embodiment, the LUMO energy level value of the first hole transporting host may be $-1.94$ eV, and the LUMO energy level value of the first electron transporting host may be $-2.7$ eV. Accordingly, the upper limit of the LUMO energy level value of the second hole transporting host may be $-1.94$ eV, which is the same value as the LUMO energy level value of the first hole transporting host, and the lower limit of the LUMO energy level value of the second hole transporting host may be $-2.32$ eV, which is an average value of the LUMO energy level of the first hole transporting host and the LUMO energy level of the first electron transporting host.

In some embodiments, the LUMO energy level value of the first hole transporting host may be $-1.94$ eV, and the LUMO energy level value of the first electron transporting host may be $-2.5$ eV. Accordingly, the upper limit of the LUMO energy level value of the second hole transporting host may be $-1.94$ eV, which is the same value as the LUMO energy level value of the first hole transporting host, and the lower limit of the LUMO energy level value of the second hole transporting host may be $-2.22$ eV, which is an average value of the LUMO energy level of the first hole transporting host and the LUMO energy level of the first electron transporting host. The dopant included in the first sub-light emitting layer GEML4-1 may emit the light of the second wavelength. As long as the dopant emits the light of the second wavelength, the material thereof is not particularly limited. For example, the dopant may include an organic metal compound.

The second sub-light emitting layer GEML4-2 may include the second host and the second hole transporting host, wherein a ratio of the second host to the second hole transporting host is in the range of 99:1 to 5:95. In the second sub-light emitting layer GEML4-2, the second hole transporting host may be doped on the second host.

The first stack ST1 may further include the hole transport region HTR which transports holes provided from the first electrode EL1 to the first light emitting layer BEML1, and a first intermediate electron transport region which transports electrons generated from the first charge generation layer CGL1 to the first light emitting layer BEML1.

In the light emitting device ED according to an embodiment, the hole transport region HTR may include a hole injection layer HIL on the first electrode EL1 and a hole transport layer HTL on the hole injection layer HIL. The hole transport layer HTL may come into contact with a lower surface of the first light emitting layer BEML1. However, embodiments of the present disclosure are not limited thereto. The hole transport region HTR may further include a hole-side additional layer on the hole transport layer HTL. The hole-side additional layer may include at least one of a hole buffer layer, a light emitting auxiliary layer, and/or an electron blocking layer. The hole buffer layer may be a layer which increases light emission efficiency by compensating for a resonance distance according to the wavelength of light emitted from a light emitting layer. The electron blocking layer may be a layer which serves to prevent (decrease) an electron from being injected from an electron transport region to a hole transport region.

The first intermediate electron transport region may include a first intermediate electron transport layer METL1 on the first-1 light emitting layer BEML1. The first intermediate electron transport layer METL1 is between the first-1 light emitting layer BEML1 and the first charge generation layer CGL1, and may come into contact with each of the first-1 light emitting layer BEML1 and the first charge generation layer CGL1. However, embodiments of the present disclosure are not limited thereto. The first intermediate electron transport region may further include a first intermediate electron-side additional layer between the first intermediate electron transport layer METL1 and the first-1 light emitting layer BEML1. The first intermediate electron-side additional layer may include at least one of an electron buffer layer and a hole blocking layer. In addition, a first intermediate electron injection layer may be between the first intermediate electron transport layer METL1 and the first charge generation layer CGL1.

The second stack ST2 may further include a first intermediate hole transport region MHTR1 which transports holes generated from the first charge generation layer CGL1 to a first-2 light emitting layer BEML2, and a second intermediate electron transport region which transports electrons provided from the second charge generation layer CGL2 to the first-2 light emitting layer BEML2.

The first intermediate hole transport region MHTR1 may include a first intermediate hole injection layer MHIL1 on the first charge generation layer CGL1, and a first intermediate hole transport layer MHTL1 on the first intermediate hole injection layer MHIL1. The first intermediate hole transport layer MHTL1 may come into contact with a lower surface of the first-2 light emitting layer BEML2. However, embodiments of the present disclosure are not limited thereto. The first intermediate hole transport region MHTR1 may further include a first intermediate hole-side additional layer on the first intermediate hole transport layer MHTL1. The first intermediate hole-side additional layer may include at least one of a hole buffer layer, a light emitting auxiliary layer, or an electron blocking layer.

The second intermediate electron transport region may include a second intermediate electron transport layer METL2 on the first-2 light emitting layer BEML2. The second intermediate electron transport layer METL2 is between the first-2 light emitting layer BEML2 and the second charge generation layer CGL2, and may come into contact with each of the first-2 light emitting layer BEML2 and the second charge generation layer CGL2. However, embodiments of the present disclosure are not limited thereto. The second intermediate electron transport region may further include a second intermediate electron-side additional layer between the second intermediate electron transport layer METL2 and the first-2 light emitting layer BEML2. The second intermediate electron-side additional layer may include at least one of an electron buffer layer and a hole blocking layer. In addition, a second intermediate electron injection layer may be between the second intermediate electron transport layer METL2 and the second charge generation layer CGL2.

The third stack ST3 may further include a second intermediate hole transport region MHTR2 which transports holes generated from the second charge generation layer CGL2 to a first-3 light emitting layer BEML3, and a third intermediate electron transport region which transports electrons provided from the third charge generation layer CGL3 to the first-3 light emitting layer BEML3.

The second intermediate hole transport region MHTR2 may include a second intermediate hole injection layer MHIL2 on the second charge generation layer CGL2, and a second intermediate hole transport layer MHTL2 on the second intermediate hole injection layer MHIL2. The second intermediate hole transport layer MHTL2 may come into contact with a lower surface of the first-3 light emitting layer BEML3. However, embodiments of the present disclosure are not limited thereto. The second intermediate hole transport region MHTR2 may further include a second intermediate hole-side additional layer on the second intermediate hole transport layer MHTL2. The second intermediate hole-side additional layer may include at least one of a hole buffer layer, a light emitting auxiliary layer, and/or an electron blocking layer.

The third intermediate electron transport region may include a third intermediate electron transport layer METL3 on the first-3 light emitting layer BEML3. The third intermediate electron transport layer METL3 is between the first-3 light emitting layer BEML3 and the third charge generation layer CGL3, and may come into contact with each of the first-3 light emitting layer BEML3 and the third charge generation layer CGL3. However, embodiments of the present disclosure are not limited thereto. The third intermediate electron transport region may further include a third intermediate electron-side additional layer between the third intermediate electron transport layer METL3 and the first-3 light emitting layer BEML3. The third intermediate electron-side additional layer may include at least one of an electron buffer layer and a hole blocking layer. In addition, a third intermediate electron injection layer may be between the third intermediate electron transport layer METL3 and the third charge generation layer CGL3.

The fourth stack ST4 may further include a third intermediate hole transport region MHTR3 which transports holes generated from the third charge generation layer CGL3 to the second light emitting layers GEML4-1 and GEML4-2, and the electron transport region ETR which transports electrons provided from the second electrode EL2 to the second light emitting layers GEML4-1 and GEML4-2.

The third intermediate hole transport region MHTR3 may include a third intermediate hole injection layer MHIL3 on the third charge generation layer CGL3, and a third intermediate hole transport layer MHTL3 on the third intermediate hole injection layer MHIL3. The third intermediate hole transport layer MHTL3 may come into contact with a lower surface of the second light emitting layers GEML4-1 and GEML4-2. However, embodiments of the present disclosure are not limited thereto. The third intermediate hole transport region MHTR3 may further include a third intermediate hole-side additional layer on the third intermediate hole transport layer MHTL3. The third intermediate hole-side additional layer may include at least one of a hole buffer layer, a light emitting auxiliary layer, and/or an electron blocking layer.

The electron transport region ETR may include an electron transport layer ETL on the second light emitting layers GEML4-1 and GEML4-2, and an electron injection layer EIL on the electron transport layer ETL. The electron transport layer ETL may come into contact with the second light emitting layers GEML4-1 and GEML4-2. However, embodiments of the present disclosure is not limited thereto. The electron transport region ETR may further include an electron-side additional layer between the electron transport layer ETL and the second light emitting layers GEML4-1 and GEML4-2. The electron-side additional layer may include at least one of an electron buffer layer and a hole blocking layer.

Figure 6B:
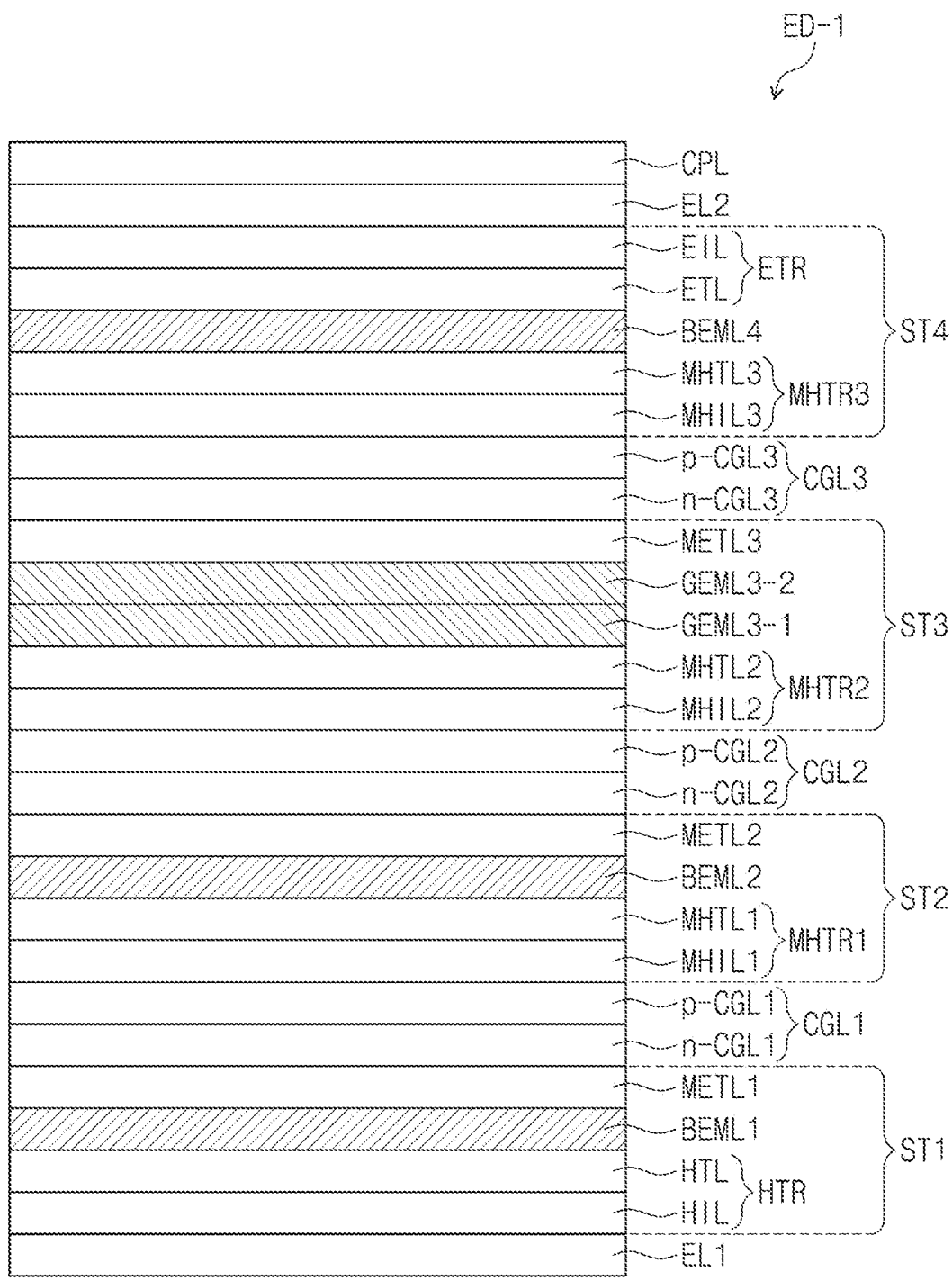
Figure 6C:
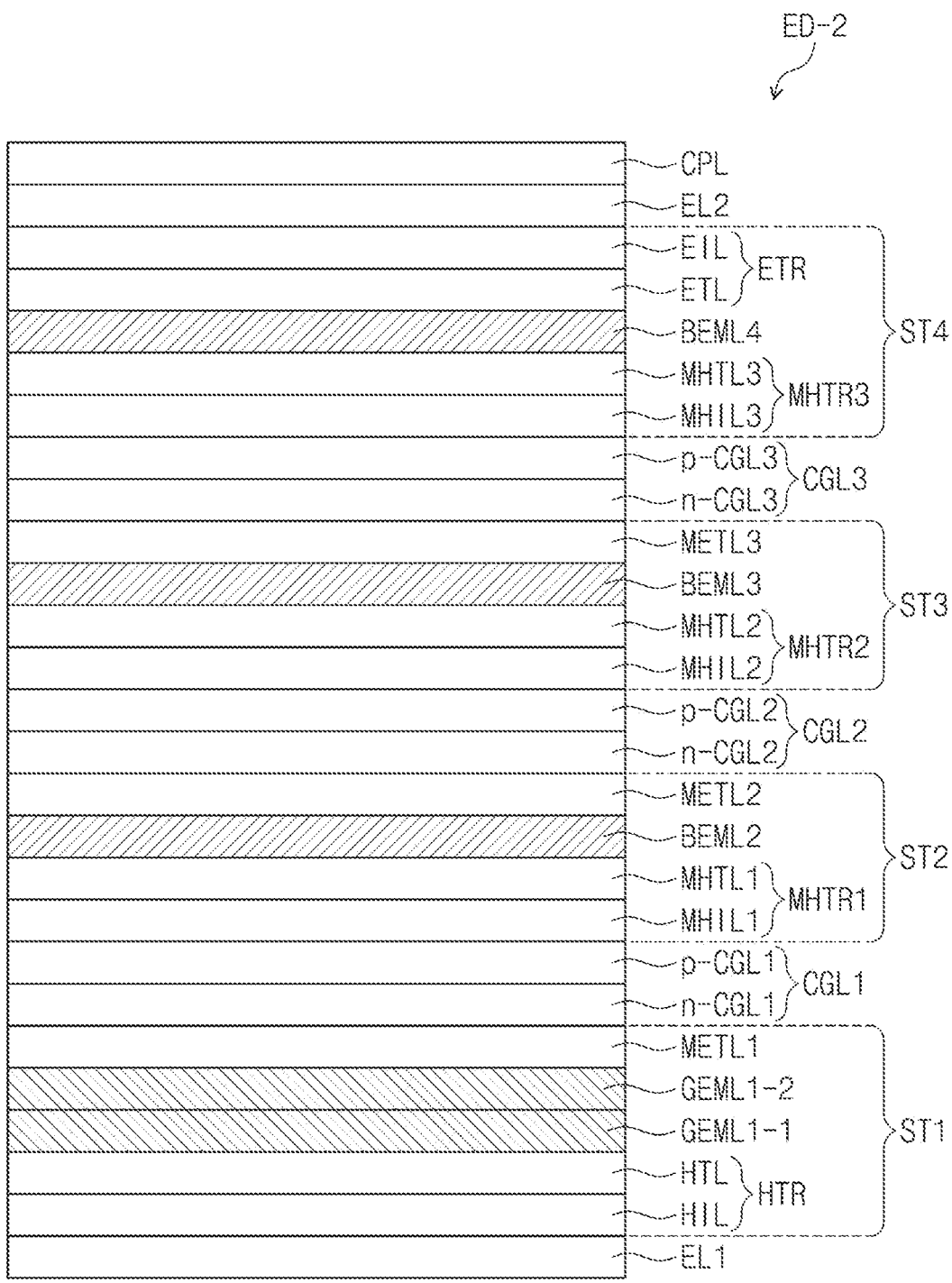

Referring to FIG. 6B and FIG. 6C, when compared to the light emitting device ED illustrated in FIG. 6A, in the light emitting devices ED-1 and ED-2 of an embodiment, a second light emitting layer may not be included in the fourth stack ST4, but in a different stack. For example, as in the light emitting device ED-1 of an embodiment illustrated in FIG. 6B, the third stack ST3 may include second light emitting layers GEML3-1 and GEML3-2, and each of the first stack ST1, the second stack ST2, and the fourth stack ST4 may include first light emitting layers BEML1, BEML2, and BEML4. In some embodiments, as in the light emitting device ED-2 of an embodiment illustrated in FIG. 6C, the first stack ST1 may include second light emitting layers GEML1-1 and GEML1-2, and each of the second stack ST2, the third stack ST3, and the fourth stack ST4 may include first light emitting layers BEML2, BEML3, and BEML4. In some embodiments, the second stack ST2 may include a second light emitting layer, and each of the first stack ST1, the third stack ST3, and the fourth stack ST4 may include a first light emitting layer.

Referring to FIG. 6A to FIG. 6C together, in the light emitting devices ED, ED-1, ED-2, and ED-3 according to an embodiment, the first electrode EL1 has conductivity. The first electrode EL1 may be formed of a metal material, a metal alloy, and/or a conductive compound. The first electrode EL1 may be an anode or a cathode. However embodiments of the present disclosure are not limited thereto. In addition, the first electrode EL1 may be a pixel electrode.

In the light emitting devices ED, ED-1, ED-2, and ED-3 according to an embodiment, the first electrode EL1 may be a reflective electrode. For example, the first electrode EL1 may include highly reflective Ag, Mg, Cu, Al, Pt, Pd, Au, Ni, Nd, Ir, Cr, Li, Ca, LiF/Ca, LiF/Al, Mo, Ti, W, In, Zn, Sn, and/or a compound or a mixture thereof (for example, a mixture of Ag and Mg). In some embodiments, the first electrode EL1 may have a multi-layered structure including a reflective film formed of any one of the above materials, and a transparent conductive film formed of indium tin oxide (ITO), indium zinc oxide (IZO), zinc oxide (ZnO), indium tin zinc oxide (ITZO), or the like. For example, the first electrode EU may have a two-layered structure of ITO/Ag or a three-layered structure of ITO/Ag/ITO, but is not limited thereto. In addition, embodiments of the present disclosure are not limited thereto. The first electrode EL1 may include any one of the above-described metal materials, a combination of two or more selected from the above-described metal materials, an oxide of any one of the above-described metal materials, and/or the like. The thickness of the first electrode EU may be about 70 nm to about 1000 nm. For example, the thickness of the first electrode EL1 may be about 100 nm to about 300 nm.

In the light emitting devices ED, ED-1, and ED-2 according to an embodiment, the hole transport region HTR and the intermediate hole transport regions MHTR1, MHTR2, and MHTR3 may have a single-layered structure having a single layer formed of a single material, a single-layered structure having a single layer formed of a plurality of different materials, or a multi-layered structure having a plurality of layers formed of a plurality of different materials.

Each of the hole transport region HTR and the intermediate hole transport regions MHTR1, MHTR2, and MHTR3 may be formed using various suitable methods such as vacuum deposition, spin coating, casting, Langmuir-Blodgett (LB), inkjet printing, laser printing, laser induced thermal imaging (LITI), and the like.

Each of the hole transport region HTR and the intermediate hole transport regions MHTR1, MHTR2, and MHTR3 may include a phthalocyanine compound such as copper phthalocyanine, $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4"-[tris(3-methylphenyl)phenylamino]triphenylamine (m-MTDATA), 4,4'4"-Tris(N,N-diphenylamino)triphenylamine (TDATA), 4,4',4"-tris[N(2-naphthyl)-N-phenylamino]-triphenylamine (2-TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonicacid (PANI/CSA), Polyaniline/Poly(4-styrenesulfonate) (PAN I/PSS), N,N'-di(naphthalene-I-yl)-N,N'-diphenyl-benzidine (NPB), triphenylamine-containing polyether ketone (TPAPEK), 4-Isopropyl-4'-methyldiphenyliodonium [Tetrakis(pentafluorophenyl) borate], dipyrazino[2,3-f: 2',3'-h] quinoxaline-2,3,6,7,10,11-hexacarbonitrile (HATCN), and/or the like.

Each of the hole transport region HTR and the intermediate hole transport regions MHTR1, MHTR2, and MHTR3 may include a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di(naphthalene-I-yl)-N,N'-diphenyl-benzidine (NPB), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), (1,3-Bis(N-carbazolyl)benzene (mCP), and/or the like.

In addition, each of the hole transport region HTR and the intermediate hole transport regions MHTR1, MHTR2, and MHTR3 may include CzSi(9-(4-tert-Butylphenyl)-3,6-bis (triphenylsilyl)-9H-carbazole), 9-phenyl-9H-3,9'-bicarbazole (CCP), 1,3-bis(1,8-dimethyl-9H-carbazol-9-yl)benzene (mDCP), and/or the like.

The hole transport region HTR may include the above-described compounds of the hole transport region in at least one of the hole injection layer HIL, the hole transport layer HTL, and/or the hole-side additional layer. The intermediate hole transport regions MHTR1, MHTR2, and MHTR3 may include the above-described compounds of the hole transport region in at least one of the intermediate hole injection layers MHIL1, MHIL2, and MHIL3, the intermediate hole transport layers MHTL1, MHTL2, and MHTL3, or an intermediate hole-side additional layer.

The thickness of each of the hole transport region HTR and the intermediate hole transport regions MHTR1, MHTR2, and MHTR3 may be about 10 nm to about 1000 nm, for example, about 10 nm to about 500 nm. The thickness of each of the hole injection layer HIL and the intermediate hole injection layers MHIL1, MHIL2, and MHIL3 may be, for example, about 5 nm to about 100 nm. The thickness of each of the hole transport layer HTL and the intermediate hole transport layers MHTL1, MHTL2, and MHTL3 may be, for example, about 5 nm to about 100 nm. When the hole transport region HTR includes the hole-side additional layer, the thickness of the hole-side additional layer may be about 1 nm to about 100 nm. When the intermediate hole transport regions MHTR1, MHTR2, and MHTR3 include the intermediate hole-side additional layer, the thickness of the intermediate hole-side additional layer may be about 1 nm to about 100 nm. When the thickness of each of the hole transport region HTR, the intermediate hole transport regions MHTR1, MHTR2, and MHTR3, and each layer included therein satisfy the above-described ranges, satisfactory (suitable) hole transport properties may be obtained without a substantial increase in a driving voltage.

Each of the hole transport region HTR and the intermediate hole transport regions MHTR1, MHTR2, and MHTR3 may further include a charge generation material in addition to the above-mentioned materials in order to further improve conductivity. The charge generation material may be uniformly (substantially uniformly) or non-uniformly dispersed in the hole transport region HTR and the intermediate hole transport regions MHTR1, MHTR2, and MHTR3. The charge generation material may be, for example, a p-type dopant. The p-type dopant may include at least one of a halogenated metal compound, a quinone derivative, a metal oxide, or a cyano group-containing compound, but embodiments of the present disclosure are not limited thereto. For example, the p-type dopant may be a halogenated metal compound such as CuI and RbI, a quinone derivative such as tetracyanoquinodimethane (TCNQ) and 2,3,5,6-tetrafluoro-7,7'8,8-tetracyanoquinodimethane (F4-TCNQ), a metal oxide such as a tungsten oxide and a molybdenum oxide, and/or the like, but embodiments of the present disclosure are not limited thereto.

The first light emitting layers BEML1, BEML2, and BEML3 and the second light emitting layers GEML4-1 and GEML4-2 are provided on the hole transport region HTR or the intermediate hole transport regions MHTR1, MHTR2, and MHTR3. The first-1 light emitting layer BEML1 is provided on the hole transport region HTR, the first-2 light emitting layer BEML2 is provided on the first intermediate hole transport region MHTR1, the first-3 light emitting layer BEML3 is provided on the second intermediate hole transport region MHTR2, and the second light emitting layers GEML4-1 and GEML4-2 are provided on the third intermediate hole transport region MHTR3.

Each of the electron transport region ETR and an intermediate electron transport region is on the first light emitting layers BEML1, BEML2, and BEML3 and the second light emitting layers GEML4-1 and GEML4-2. Each of the electron transport region ETR and the intermediate electron transport region may have a single-layered structure having a single layer formed of a single material, a single-layered structure having a single layer formed of a plurality of different materials, or a multi-layered structure having a plurality of layers formed of a plurality of different materials.

Each of the electron transport region ETR and the intermediate electron transport region may be formed using various suitable methods such as vacuum deposition, spin coating, casting, Langmuir-Blodgett (LB), inkjet printing, laser printing, laser induced thermal imaging (LITI), and/or the like.

Each of the electron transport region ETR and the intermediate electron transport region may include an anthracene-based compound. However, embodiments of the present disclosure are not limited thereto. Each of the electron transport region ETR and the intermediate electron transport region may include tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine (T2T), 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1, O8)-(1,1'-biphenyl-4-olato)aluminum (BAlq), berylliumbis(benzoquinolin-10-olate) ($Bebq_2$), 9,10-di(naphthalene-2-yl)anthracene (ADN), 1,3-bis[3,5-di(pyridin-3-yl)phenyl]benzene (BmPyPhB), and/or a compound thereof.

In addition, each of the electron transport region ETR and the intermediate electron transport region may include a halogenated metal such as LiF, NaCl, CsF, RbCl, RbI, CuI, and KI, a lanthanum group metal such as Yb, or a co-deposition material of the above halogenated metal and the lanthanum group metal. For example, the electron transport region ETR and the intermediate electron transport region may include KI:Yb, RbI:Yb, and/or the like as the co-deposition material. In some embodiments, a metal oxide such as $Li_2O$ and BaO, or 8-hydroxyl-Lithium quinolate (Liq) and/or the like may be used as the electron transport region ETR and the intermediate electron transport region, but embodiments of the present disclosure are not limited thereto. Each of the electron transport region ETR and the intermediate electron transport region may also be composed of a mixture of an electron transport material and an insulating organo metal salt. The organo metal salt may be a material having an energy band gap of about 4 eV or greater. For example, the organo metal salt may include metal acetate, metal benzoate, metal acetoacetate, metal acetylacetonate, or metal stearate.

Each of the electron transport region ETR and the intermediate electron transport region may further include at least one of 2,9-dimethyl-4,7-diphenyl-1,10-phenanthroline (BCP) and 4,7-diphenyl-1,10-phenanthroline (Bphen) in addition to the above-mentioned materials, but embodiments of the present disclosure are not limited thereto.

The electron transport region ETR may include the above-described compounds of the electron transport region in an electron injection layer EIL or the electron transport layer ETL. When the electron transport region ETR includes the electron-side additional layer, the electron-side additional layer may include the above-described material. The intermediate electron transport region may include the above-described compounds of the electron transport region in the intermediate electron transport layers METL1, METL2, and METL3. The intermediate electron transport region may include the above-described compounds of the electron transport region in an intermediate electron-side additional layer or an intermediate electron injection layer.

The thickness of each of the electron transport region ETR and the intermediate electron transport region may be, for example, about 100 nm to about 150 nm. The thicknesses of the electron transport layer ETL may be about 0.1 nm to about 100 nm, for example, about 0.3 nm to about 50 nm. When the thickness of the electron transport layer ETL satisfies the above-described range, satisfactory (suitable) electron transport properties may be obtained without a substantial increase in a driving voltage. The thickness of the electron injection layer EIL may be about 0.1 nm to about 10 nm, or about 0.3 nm to about 9 nm. When the thickness of the electron injection layer EIL satisfies the above-described range, satisfactory (suitable) electron injection properties may be obtained without a substantial increase in a driving voltage. The thicknesses of the intermediate electron transport layers METL1, METL2, and METL3 included in the intermediate electron transport region may be about 0.1 nm to about 100 nm, for example, about 0.1 nm to about 50 nm.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second electrode EL2 may be a cathode, and when the first electrode EL1 is a cathode, the second electrode EL2 may be an anode.

The second electrode EL2 may be a transflective electrode or a transmissive electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), and/or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, In, Zn, Sn, and/or a compound or a mixture thereof (for example, AgMg, AgYb, or MgAg). In some embodiments, the second electrode EL2 may be a multi-layered structure including a reflective film or a transflective film, both formed of the above-described materials, and a transparent conductive film formed of indium tin oxide (ITO), indium zinc oxide (IZO), zinc oxide (ZnO), indium tin zinc oxide (ITZO), and/or the like. For example, the second electrode EL2 may include any one of the above-described metal materials, a combination of two or more selected from the above-described metal materials, an oxide of any one of the above-described metal materials, and/or the like.

In some embodiments, the second electrode EL2 maybe connected (coupled) to an auxiliary electrode. When the second electrode EL2 is connected to the auxiliary electrode, the resistance of the second electrode EL2 may be reduced.

In some embodiments, a capping layer CPL may be on the second electrode EL2 of the light emitting devices ED, ED-1, and ED-2. The capping layer CPL may include a multilayer or single layer.

In an embodiment, the capping layer CPL may be an organic layer or an inorganic layer. For example, when the capping layer CPL includes an inorganic substance, the inorganic substance may include an alkaline metal compound such as LiF, an alkaline earth metal compound such as $MgF_2$, SiON, $SiN_x$, SiOy, and/or the like.

For example, when the capping layer CPL includes an organic substance, the organic substance may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4''-Tris (carbazol sol-9-yl) triphenylamine (TCTA), and/or the like, or may include an epoxy resin, or an acrylate such as a methacrylate. However, embodiments of the present disclosure are not limited thereto. The capping layer CPL may include at least one of the following compounds P1 to P5.

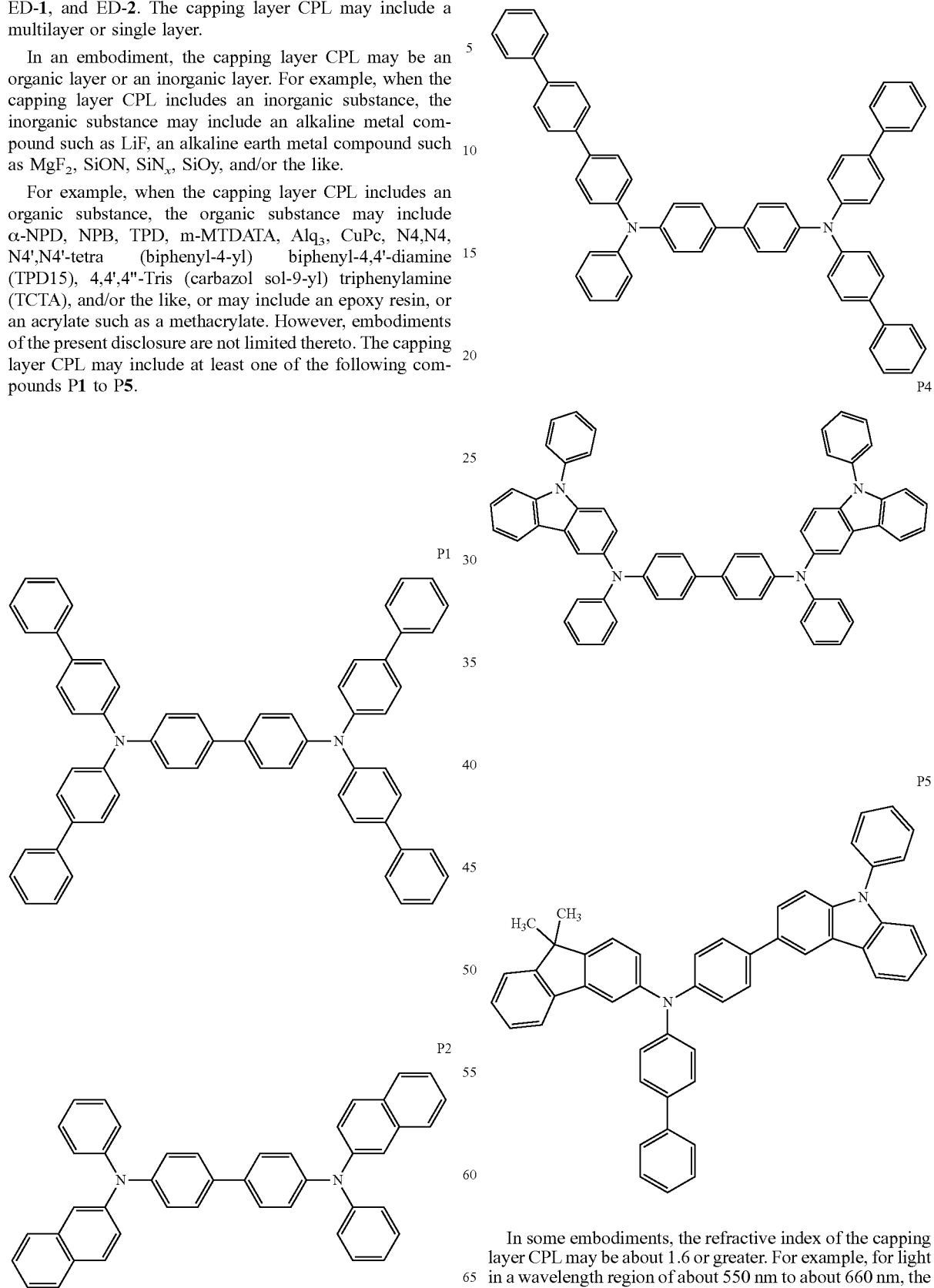

In some embodiments, the refractive index of the capping layer CPL may be about 1.6 or greater. For example, for light in a wavelength region of about 550 nm to about 660 nm, the refractive index of the capping layer CPL may be about 1.6 or greater.

A light emitting device according to an embodiment of the present disclosure includes a first light emitting layer which emits light having a wavelength range of 420 nm to 480 nm and a second light emitting layer which emits light having a wavelength range of 520 nm to 600 nm, wherein the first light emitting layer has a single-layered structure and the second light emitting layer has a double-layered structure including a first sub-light emitting layer having a first host and a dopant and a second sub-light emitting layer having the first host and a second hole transporting host. The second sub-light emitting layer improves the ratio of a hole transporting host in a region adjacent to an electron transport region to improve (increase) charge balance close to 100%. Therefore, a display device according to an embodiment of the present disclosure may improve light emitting efficiency by preventing or reducing quenching.

Hereinafter, with reference to Examples and Comparative Examples, results of properties evaluation of a light emitting device according to an embodiment of the present disclosure will be described. In addition, the following Examples are for illustrative purposes only to facilitate the understanding of the present disclosure, and thus, the scope of the present disclosure is not limited thereto.

TABLE 1

| | Second light emitting layer | Materials |
|---|---|---|
| Comparative Example 1 | GEML4-1 | First host and dopant |
| Comparative Example 2 | GEML4-1 GEML4-2 | First host and dopant Second host:Second hole transporting host = 99.5:0.5 |
| Example 1 | GEML4-1 GEML4-2 | First host and dopant Second host:Second hole transporting host = 99.0:1.0 |
| Example 2 | GEML4-1 GEML4-2 | First host and dopant Second host:Second hole transporting host = 98.5:1.5 |

Evaluation results of Examples and Comparative Examples are shown in Table 2 below. In the evaluation of the display module of Table 2, color coordinates and light emitting efficiency in each pixel region were measured. The degree of improvement in overall light emitting efficiency with respect to Comparative Example 1 was expressed by %.

TABLE 2

| | Red pixel region (PXA-R) | | Green pixel region (PXA-G) | | Blue pixel region (PXA-B) | | |
|---|---|---|---|---|---|---|---|
| | Color coordinates (x, y) | Efficiency (Cd/A) | Color coordinates (x, y) | Efficiency (Cd/A) | Color coordinates (x, y) | Efficiency (Cd/A) | Improvement rate (%) |
| Comparative Example 1 | 0.697, 0.300 | 2.15 | 0.231, 0.731 | 15.21 | 0.143, 0.045 | 4.32 | 100.0 |
| Comparative Example 2 | 0.696, 0.300 | 2.11 | 0.232, 0.731 | 15.05 | 0.143, 0.045 | 4.32 | 98.9 |
| Example 1 | 0.696, 0.301 | 2.17 | 0.233, 0.731 | 15.33 | 0.143, 0.045 | 4.32 | 100.9 |
| Example 2 | 0.696, 0.301 | 2.24 | 0.234, 0.730 | 15.67 | 0.143, 0.045 | 4.32 | 103.7 |

Manufacturing and Evaluation of Display Device

The following Examples and Comparative Examples were all manufactured as a display module having the same structure as in FIG. 4A, except that the structure or material of the fourth stack ST4 was different. Example 1, Example 2, and Comparative Example 2 have the structure of a light emitting device as shown in FIG. 6A. In Example 1, Example 2, and Comparative Example 2, a second light emitting layer includes a first sub-light emitting layer GEML4-1 of 24 nm and a second sub-light emitting layer GEML4-2 of 1 nm. However, the ratio of a second hole transporting host included in the second sub-light emitting layer GEML4-2 is different as shown in Table 1. Meanwhile, Comparative Example 1 has the same structure as Examples except that the first sub-light emitting layer GEML4-1 is included but the second sub-light emitting layer GEML4-2 is not included. The LUMO energy level value of a first hole transporting host included in a second light emitting layer of each of Examples and Comparative Examples is −1.93, and the LUMO energy level value of a second hole transporting host included therein is −1.90.

Referring to the results in Table 2, it can be confirmed that the display modules of Examples have an improved (increased) light emitting efficiency compared to the display modules of Comparative Examples. For example, it can be confirmed that while achieving the same light emitting efficiency as in the prior art in the blue pixel region, an improved light emitting efficiency may be simultaneously (concurrently) achieved in the red pixel region and the green pixel region.

According to an embodiment of the present disclosure, a light emitting device and a display device having improved light emitting efficiency may be provided by improving the charge balance of a light emitting layer in the light emitting device.

Although the present disclosure has been described with reference to embodiments of the present disclosure, it will be understood by those skilled in the art that various suitable modifications and changes in form and details may be made therein without departing from the spirit and scope of the present disclosure as set forth in the following claims. Accordingly, the technical scope of the present disclosure is not intended to be limited to the contents set forth in the detailed description of the disclosure, but is intended to be defined by the following claims, and equivalents thereof.

What is claimed is:

1. A light emitting device comprising:
a first electrode;
a hole transport region on the first electrode;
a first light emitting layer on the hole transport region, wherein the first emitting layer emits light of a first wavelength;
a second light emitting layer on the hole transport region, wherein the second emitting layer emits light of a second wavelength, and wherein the second wavelength is different from the first wavelength;
an electron transport region on the first light emitting layer and the second light emitting layer; and
a second electrode on the electron transport region,
wherein the second light emitting layer comprises:
a first sub-light emitting layer, wherein the first sub-light emitting layer comprises a first host having a first hole transporting host, a first electron transporting host and a dopant emitting the light of the second wavelength; and
a second sub-light emitting layer, wherein the second sub-light emitting layer comprises a second host and a second hole transporting host, and wherein the second sub-light emitting layer does not comprise a dopant.

2. The light emitting device of claim 1, wherein the first wavelength is 420 nm to 480 nm, and the second wavelength is 520 nm to 600 nm.

3. The light emitting device of claim 1, wherein:
the first hole transporting host has a LUMO energy level value higher than that of the first electron transporting host; and
the second hole transporting host has a LUMO energy level value equal to or lower than that of the first hole transporting host, and higher than that of the first electron transporting host.

4. The light emitting device of claim 3, wherein the lower limit value of the LUMO energy level of the second hole transporting host is an average value of the LUMO energy level of the first hole transporting host and the LUMO energy level of the first electron transporting host.

5. The light emitting device of claim 3, wherein the LUMO energy level value of the second hole transporting host is −1.94 eV to −2.32 eV.

6. The light emitting device of claim 1, wherein in the second sub-light emitting layer, a ratio of the second host to the second hole transporting host is in the range of 99:1 to 5:95.

7. The light emitting device of claim 1, wherein the second host comprises a third hole transporting host and a second electron transporting host.

8. The light emitting device of claim 1, further comprising a charge generation layer between the first light emitting layer and the second light emitting layer.

9. The light emitting device of claim 8, wherein the charge generation layer comprises:
a p-type charge generation layer doped with a p-type dopant; and
an n-type charge generation layer doped with an n-type dopant.

10. The light emitting device of claim 8, further comprising:
an intermediate electron transport layer between the first light emitting layer and the charge generation layer; and
an intermediate hole transport layer between the charge generation layer and the second light emitting layer.

11. The light emitting device of claim 1, further comprising a first additional light emitting layer between the hole transport region and the electron transport region, wherein the first additional light emitting layer emits the light of the first wavelength.

12. The light emitting device of claim 11, further comprising a second additional light emitting layer between the first light emitting layer and the second light emitting layer, wherein the second additional light emitting layer emits the light of the first wavelength.

13. The light emitting device of claim 1, wherein:
the hole transport region comprises a hole injection layer on the first electrode, and a hole transport layer on the hole injection layer; and
the electron transport region comprises an electron transport layer on the first light emitting layer and the second light emitting layer, and an electron injection layer on the electron transport layer.

14. The light emitting device of claim 1, further comprising a capping layer on the second electrode, wherein the capping layer has a refractive index of 1.6 or greater.

15. The light emitting device of claim 1, wherein the first sub-light emitting layer and the second sub-light emitting layer are in contact with each other.

16. A display device comprising:
a display panel comprising:
a first pixel region, wherein the first pixel region emits light of a first wavelength;
a second pixel region, wherein the second pixel region emits light of a second wavelength, and wherein the second wavelength is different from the first wavelength;
a third pixel region, wherein the third pixel region emits light of a third wavelength, and wherein the third wavelength is different from the second wavelength; and
a light emitting device overlapping the first pixel region to the third pixel region; and
the display device further comprises a light control layer on the display panel;
a first light control unit overlapping the first pixel region;
a second light control unit overlapping the second pixel region; and
a third light control unit overlapping the third pixel region,
wherein the light emitting device comprises:
a first electrode;
a hole transport region on the first electrode;
a first light emitting layer on the hole transport region, wherein the first light emitting layer emits the light of the first wavelength;
a second light emitting layer on the hole transport region, wherein the second emitting layer emits the light of the second wavelength;
an electron transport region on the first light emitting layer and the second light emitting layer; and
a second electrode on the electron transport region,
wherein the second light emitting layer comprises a first sub-light emitting layer comprising a first host having a first hole transporting host and a dopant, wherein the dopant emits the light of the second wavelength; and
the second emitting layer further comprises a second sub-light emitting layer, wherein the second sub-light emitting layer comprises a second host and a second hole transporting host having a LUMO energy level equal to or lower than that of the first hole transporting host and does not comprise a dopant.

17. The display device of claim 16, wherein the first wavelength is 420 nm to 480 nm, and the second wavelength is 520 nm to 600 nm.

18. The display device of claim 16, wherein the LUMO energy level value of the second hole transporting host is −1.94 eV to −2.32 eV.

19. The display device of claim 18, wherein the first host further comprises a first electron transporting host, wherein the lower limit value of the LUMO energy level of the second hole transporting host is an average value of the LUMO energy level of the first hole transporting host and the LUMO energy level of the first electron transporting host.

20. The display device of claim 16, wherein:
   the second light control unit comprises a quantum dot configured to convert the light of the first wavelength to light of the second wavelength; and
   the third light control unit comprises a quantum dot configured to convert the light of the first wavelength or the light of the second wavelength to the light of the third wavelength.

21. The display device of claim 16, further comprising a color filter layer on the light control layer.

\* \* \* \* \*